(12) United States Patent
Choi et al.

(10) Patent No.: US 7,670,530 B2
(45) Date of Patent: Mar. 2, 2010

(54) PATTERNING SUBSTRATES EMPLOYING MULTIPLE CHUCKS

(75) Inventors: Byung-Jin Choi, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 337 days.

(21) Appl. No.: 11/625,082

(22) Filed: Jan. 19, 2007

(65) Prior Publication Data

US 2007/0170617 A1   Jul. 26, 2007

Related U.S. Application Data

(63) Continuation-in-part of application No. 11/565,350, filed on Nov. 30, 2006.

(60) Provisional application No. 60/760,738, filed on Jan. 20, 2006, provisional application No. 60/827,125, filed on Sep. 27, 2006, provisional application No. 60/788,808, filed on Apr. 3, 2006.

(51) Int. Cl.
    *B28B 11/08*    (2006.01)
(52) U.S. Cl. .................. 264/293; 264/319; 977/887
(58) Field of Classification Search ............... 264/293, 264/106, 107; 977/887
    See application file for complete search history.

(56) References Cited

U.S. PATENT DOCUMENTS 3,503,538 A   3/1970   Barnes
4,022,855 A   5/1977   Hamblen
4,070,116 A   1/1978   Frosch et al.

(Continued)

FOREIGN PATENT DOCUMENTS

EP   0 795 016 A1   9/1997

(Continued)

OTHER PUBLICATIONS

Feynman, There's Plenty of Room at the Bottom, Dec. 1, 1959.

(Continued)

*Primary Examiner*—Kahnh Nguyen
*Assistant Examiner*—John Blades
(74) *Attorney, Agent, or Firm*—Laura C. Robinson

(57) ABSTRACT

The present invention is directed towards a method for patterning first and second substrates in a nanoimprint lithography system, the method including, inter alia, positioning the first substrate on a first substrate chuck; positioning a nanoimprint material on the first substrate; obtaining a spatial relationship between the first substrate and a nanoimprint mold assembly and imprinting a pattern in the nanoimprint material on the first substrate with the nanoimprint mold assembly while concurrently positioning the second substrate on a second substrate chuck; separating the nanoimprint mold assembly from the nanoimprint material on the first substrate; positioning a nanoimprint material on the second substrate; removing the first substrate from the first substrate chuck while concurrently obtaining a spatial relationship between the second substrate and the nanoimprint mold assembly and imprinting a pattern in the nanoimprint material on the second substrate with the nanoimprint mold assembly; and separating the nanoimprint mold assembly from the nanoimprint material on the second substrate, with the first and second substrates being subjected to substantially the same process conditions.

21 Claims, 26 Drawing Sheets

U.S. PATENT DOCUMENTS

| | | |
|---|---|---|
| 4,208,240 A | 6/1980 | Latos |
| 4,233,261 A | 11/1980 | Mijnheer |
| 4,364,971 A | 12/1982 | Sack et al. |
| 4,440,804 A | 4/1984 | Milgram |
| 4,506,184 A | 3/1985 | Siddall |
| 4,512,848 A | 4/1985 | Deckman et al. |
| 4,521,445 A | 6/1985 | Nablo et al. |
| 4,551,192 A | 11/1985 | DiMilia et al. |
| 4,552,832 A | 11/1985 | Blume et al. |
| 4,559,717 A | 12/1985 | Scire et al. |
| 4,576,900 A | 3/1986 | Chiang |
| 4,637,904 A | 1/1987 | Rounds |
| 4,676,868 A | 6/1987 | Riley et al. |
| 4,707,218 A | 11/1987 | Giammarco et al. |
| 4,731,155 A | 3/1988 | Napoli et al. |
| 4,737,425 A | 4/1988 | Lin et al. |
| 4,848,911 A | 7/1989 | Uchida et al. |
| 4,857,477 A | 8/1989 | Kanamori |
| 4,862,019 A | 8/1989 | Ashmore, Jr. |
| 4,866,307 A | 9/1989 | Ashmore, Jr. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,932,358 A | 6/1990 | Studley et al. |
| 4,936,465 A | 6/1990 | Zold |
| 4,957,663 A | 9/1990 | Zwiers et al. |
| 4,959,252 A | 9/1990 | Bonnebat et al. |
| 4,964,945 A | 10/1990 | Calhoun |
| 4,980,316 A | 12/1990 | Huebner |
| 5,003,062 A | 3/1991 | Yen |
| 5,028,361 A | 7/1991 | Fujimoto |
| 5,028,366 A | 7/1991 | Harakal et al. |
| 5,053,318 A | 10/1991 | Gulla et al. |
| 5,073,230 A | 12/1991 | Maracas et al. |
| 5,110,514 A | 5/1992 | Soane |
| 5,124,089 A | 6/1992 | Ohkoshi et al. |
| 5,126,006 A | 6/1992 | Cronin et al. |
| 5,148,037 A | 9/1992 | Suda et al. |
| 5,151,754 A | 9/1992 | Ishibashi et al. |
| 5,212,147 A | 5/1993 | Sheats |
| 5,232,874 A | 8/1993 | Rhodes et al. |
| 5,240,550 A | 8/1993 | Boehnke et al. |
| 5,240,878 A | 8/1993 | Fitzsimmons et al. |
| 5,244,818 A | 9/1993 | Jokerst et al. |
| 5,246,880 A | 9/1993 | Reele et al. |
| 5,250,472 A | 10/1993 | Chen et al. |
| 5,259,926 A | 11/1993 | Kuwabara et al. |
| 5,277,749 A | 1/1994 | Griffith et al. |
| 5,288,436 A | 2/1994 | Liu et al. |
| 5,324,012 A | 6/1994 | Aoyama et al. |
| 5,324,683 A | 6/1994 | Fitch et al. |
| 5,328,810 A | 7/1994 | Lowrey et al. |
| 5,330,881 A | 7/1994 | Sidman et al. |
| 5,331,371 A | 7/1994 | Mori et al. |
| 5,357,122 A | 10/1994 | Okubora et al. |
| 5,362,606 A | 11/1994 | Hartney et al. |
| 5,362,940 A | 11/1994 | MacDonald et al. |
| 5,364,222 A | 11/1994 | Akimoto et al. |
| 5,366,851 A | 11/1994 | Novembre |
| 5,371,822 A | 12/1994 | Horwitz et al. |
| 5,374,327 A | 12/1994 | Imahashi et al. |
| 5,376,810 A | 12/1994 | Hoenk et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,434,107 A | 7/1995 | Paranjpe |
| 5,445,195 A | 8/1995 | Kim |
| 5,449,117 A | 9/1995 | Muderlak et al. |
| 5,451,435 A | 9/1995 | Yu |
| 5,453,157 A | 9/1995 | Jeng |
| 5,458,520 A | 10/1995 | DeMercuio et al. |
| 5,468,542 A | 11/1995 | Crouch |
| 5,480,047 A | 1/1996 | Tanigawa et al. |
| 5,512,131 A | 4/1996 | Kumar et al. |
| 5,515,167 A | 5/1996 | Ledger et al. |
| 5,534,073 A | 7/1996 | Kinoshita et al. |
| 5,542,605 A | 8/1996 | Campau |
| 5,545,367 A | 8/1996 | Bae et al. |
| 5,563,684 A | 10/1996 | Stagaman |
| 5,601,641 A | 2/1997 | Stephens |
| 5,612,068 A | 3/1997 | Kempf et al. |
| 5,628,917 A | 5/1997 | MacDonald et al. |
| 5,643,364 A | 7/1997 | Zhao et al. |
| 5,654,238 A | 8/1997 | Cronin et al. |
| 5,669,303 A | 9/1997 | Maracas et al. |
| 5,736,424 A | 4/1998 | Prybyla et al. |
| 5,737,064 A | 4/1998 | Inoue et al. |
| 5,753,014 A | 5/1998 | Van Rijn |
| 5,772,905 A | 6/1998 | Chou |
| 5,776,748 A | 7/1998 | Singhvi et al. |
| 5,779,799 A | 7/1998 | Davis |
| 5,804,474 A | 9/1998 | Sakaki et al. |
| 5,812,629 A | 9/1998 | Clauser |
| 5,817,579 A | 10/1998 | Ko et al. |
| 5,820,769 A | 10/1998 | Chou |
| 5,843,363 A | 12/1998 | Mitwalsky et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,895,263 A | 4/1999 | Carter et al. |
| 5,900,062 A | 5/1999 | Loewenhardt et al. |
| 5,900,160 A | 5/1999 | Whitesides et al. |
| 5,907,782 A | 5/1999 | Wu |
| 5,923,408 A | 7/1999 | Takabayashi |
| 5,926,690 A | 7/1999 | Toprac et al. |
| 5,948,470 A | 9/1999 | Harrison et al. |
| 5,948,570 A | 9/1999 | Kornblit et al. |
| 5,956,216 A | 9/1999 | Chou |
| 5,974,150 A | 10/1999 | Kaish et al. |
| 5,983,906 A | 11/1999 | Zhao et al. |
| 6,019,166 A | 2/2000 | Viswanath et al. |
| 6,046,056 A | 4/2000 | Parce et al. |
| 6,048,799 A | 4/2000 | Prybyla |
| 6,067,144 A | 5/2000 | Murouchi |
| 6,074,827 A | 6/2000 | Nelson et al. |
| 6,137,562 A | 10/2000 | Masuyuki et al. |
| 6,150,680 A | 11/2000 | Eastman et al. |
| 6,160,430 A | 12/2000 | Drapkin et al. |
| 6,180,239 B1 | 1/2001 | Whitesides et al. |
| 6,182,510 B1 | 2/2001 | Stanke et al. |
| 6,218,316 B1 | 4/2001 | Marsh |
| 6,220,561 B1 | 4/2001 | Garcia |
| 6,242,363 B1 | 6/2001 | Zhang |
| 6,245,213 B1 | 6/2001 | Olsson et al. |
| 6,247,579 B1 | 6/2001 | Fujiyama et al. |
| 6,274,294 B1 | 8/2001 | Hines |
| 6,304,424 B1 | 10/2001 | Mett et al. |
| 6,305,677 B1 | 10/2001 | Lenz |
| 6,309,580 B1 | 10/2001 | Chou |
| 6,313,567 B1 | 11/2001 | Maltabes et al. |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,383,928 B1 | 5/2002 | Eissa |
| 6,387,330 B1 | 5/2002 | Bova et al. |
| 6,387,783 B1 | 5/2002 | Furukawa et al. |
| 6,388,253 B1 | 5/2002 | Su |

| | | | | | | |
|---|---|---|---|---|---|---|
| 6,391,217 | B2 | 5/2002 | Schaffer et al. | 7,060,402 B2 | 6/2006 | Choi et al. |
| 6,391,798 | B1 | 5/2002 | DeFelice et al. | 7,070,405 B2 | 7/2006 | Sreenivasan et al. |
| 6,407,006 | B1 | 6/2002 | Levert et al. | 7,071,088 B2 | 7/2006 | Watts et al. |
| 6,423,207 | B1 | 7/2002 | Heidari et al. | 7,077,992 B2 | 7/2006 | Sreenivasan et al. |
| 6,482,742 | B1 | 11/2002 | Chou | 7,090,716 B2 | 8/2006 | McMackin et al. |
| 6,495,907 | B1 | 12/2002 | Jain et al. | 7,098,572 B2 | 8/2006 | Choi et al. |
| 6,498,640 | B1 | 12/2002 | Ziger | 7,105,452 B2 | 9/2006 | Sreenivasan |
| 6,503,829 | B2 | 1/2003 | Kim et al. | 7,117,583 B2 | 10/2006 | Dinan et al. |
| 6,512,401 | B2 | 1/2003 | Clark et al. | 7,128,875 B2 | 10/2006 | Cubicciotti |
| 6,514,672 | B2 | 2/2003 | Young et al. | 7,150,622 B2 | 12/2006 | Choi et al. |
| 6,517,977 | B2 | 2/2003 | Resnick et al. | 7,157,036 B2 | 1/2007 | Choi et al. |
| 6,517,995 | B1 | 2/2003 | Jacobson et al. | 7,179,079 B2 | 2/2007 | Sreenivasan et al. |
| 6,518,189 | B1 | 2/2003 | Chou | 7,214,624 B2 | 5/2007 | Fujita et al. |
| 6,521,536 | B1 | 2/2003 | Robinson | 7,224,443 B2 | 5/2007 | Choi et al. |
| 6,534,418 | B1 | 3/2003 | Plat et al. | 7,244,386 B2 | 7/2007 | Sreenivasan et al. |
| 6,541,360 | B1 | 4/2003 | Plat et al. | 7,245,358 B2 | 7/2007 | Nimmakayala et al. |
| 6,545,744 | B2 | 4/2003 | Zemel | 7,252,715 B2 | 8/2007 | Watts et al. |
| 6,565,928 | B2 | 5/2003 | Sakamoto et al. | 7,259,833 B2 | 8/2007 | Nimmakayala et al. |
| 6,580,172 | B2 | 6/2003 | Mancini et al. | 7,270,533 B2 | 9/2007 | McMackin et al. |
| 6,586,268 | B1 | 7/2003 | Kopola et al. | 7,281,919 B2 | 10/2007 | Shackleton et al. |
| 6,593,240 | B1 | 7/2003 | Page | 7,282,550 B2 | 10/2007 | Xu et al. |
| 6,612,590 | B2 | 9/2003 | Coomer et al. | 7,298,456 B2 | 11/2007 | Cherala et al. |
| 6,621,960 | B2 | 9/2003 | Wang et al. | 7,307,697 B2 | 12/2007 | GanapathiSubramanian et al. |
| 6,623,579 | B1 | 9/2003 | Smith et al. | 7,316,554 B2 | 1/2008 | Choi et al. |
| 6,627,544 | B2 | 9/2003 | Izumi et al. | 7,323,130 B2 | 1/2008 | Nimmakayala et al. |
| 6,629,292 | B1 | 9/2003 | Corson et al. | 7,338,275 B2 | 3/2008 | Choi et al. |
| 6,632,742 | B2 | 10/2003 | Yang et al. | 7,360,851 B1 | 4/2008 | Snyder |
| 6,635,581 | B2 | 10/2003 | Wong | 7,396,475 B2 | 7/2008 | Sreenivasan |
| 6,646,662 | B1 | 11/2003 | Nebashi et al. | 7,462,028 B2 | 12/2008 | Cherala et al. |
| 6,665,014 | B1 | 12/2003 | Assadi et al. | 2001/0023829 A1 | 9/2001 | Olsson et al. |
| 6,677,252 | B2 | 1/2004 | Marsh | 2002/0018190 A1 | 2/2002 | Nogawa et al. |
| 6,678,038 | B2 | 1/2004 | Binnard | 2002/0038916 A1 | 4/2002 | Chiu et al. |
| 6,696,220 | B2 | 2/2004 | Bailey et al. | 2002/0042027 A1 | 4/2002 | Chou et al. |
| 6,713,238 | B1 | 3/2004 | Chou et al. | 2002/0069525 A1 | 6/2002 | Hada et al. |
| 6,716,754 | B2 | 4/2004 | Hofmann et al. | 2002/0094496 A1 | 7/2002 | Choi et al. |
| 6,719,915 | B2 | 4/2004 | Willson et al. | 2002/0110992 A1 | 8/2002 | Ho |
| 6,726,195 | B1 | 4/2004 | Hertz et al. | 2002/0111036 A1 | 8/2002 | Zhu et al. |
| 6,736,408 | B2 | 5/2004 | Olgado et al. | 2002/0132482 A1 | 9/2002 | Chou |
| 6,741,338 | B2 | 5/2004 | McArthur et al. | 2002/0150398 A1 | 10/2002 | Choi et al. |
| 6,771,372 | B1 | 8/2004 | Traber | 2002/0167117 A1 | 11/2002 | Chou |
| 6,776,094 | B1 | 8/2004 | Whitesides et al. | 2002/0168578 A1 | 11/2002 | Wang et al. |
| 6,805,054 | B1 | 10/2004 | Meissl et al. | 2002/0170880 A1 | 11/2002 | Chen |
| 6,809,356 | B2 | 10/2004 | Chou | 2002/0177319 A1 | 11/2002 | Chou |
| 6,809,802 | B1 | 10/2004 | Tsukamoto et al. | 2002/0191141 A1 | 12/2002 | Liao |
| 6,828,244 | B2 | 12/2004 | Chou | 2003/0025895 A1 | 2/2003 | Binnard |
| 6,833,325 | B2 | 12/2004 | Huang et al. | 2003/0034329 A1 | 2/2003 | Chou |
| 6,842,229 | B2 | 1/2005 | Sreenivasan et al. | 2003/0062334 A1 | 4/2003 | Lee et al. |
| 6,849,558 | B2 | 2/2005 | Schaper | 2003/0080471 A1 | 5/2003 | Chou |
| 6,870,301 | B2 | 3/2005 | Choi et al. | 2003/0080472 A1 | 5/2003 | Chou |
| 6,871,558 | B2 | 3/2005 | Choi et al. | 2003/0081193 A1 | 5/2003 | White et al. |
| 6,873,087 | B1 | 3/2005 | Choi et al. | 2003/0092261 A1 | 5/2003 | Kondo et al. |
| 6,879,162 | B2 | 4/2005 | Aguero et al. | 2003/0129542 A1 | 7/2003 | Shih et al. |
| 6,898,064 | B1 | 5/2005 | Berman et al. | 2003/0137494 A1 | 7/2003 | Tulbert |
| 6,900,881 | B2 | 5/2005 | Sreenivasan et al. | 2003/0151714 A1 | 8/2003 | Takahashi et al. |
| 6,908,861 | B2 | 6/2005 | Sreenivasan et al. | 2003/0174435 A1 | 9/2003 | Dinan et al. |
| 6,916,584 | B2 | 7/2005 | Sreenivasan et al. | 2003/0179354 A1 | 9/2003 | Araki et al. |
| 6,916,585 | B2 | 7/2005 | Sreenivasan et al. | 2003/0184917 A1 | 10/2003 | Chang et al. |
| 6,922,906 | B2 | 8/2005 | Choi et al. | 2003/0186140 A1 | 10/2003 | Fries |
| 6,926,929 | B2 | 8/2005 | Watts et al. | 2003/0197312 A1 | 10/2003 | Hougham et al. |
| 6,932,934 | B2 | 8/2005 | Choi et al. | 2003/0224116 A1 | 12/2003 | Chen et al. |
| 6,946,360 | B2 | 9/2005 | Chou | 2004/0029041 A1 | 2/2004 | Shih et al. |
| 6,951,173 | B1 | 10/2005 | Meissl et al. | 2004/0036201 A1 | 2/2004 | Chou et al. |
| 6,955,767 | B2 | 10/2005 | Chen | 2004/0036850 A1 | 2/2004 | Tsukamoto et al. |
| 6,955,868 | B2 | 10/2005 | Choi et al. | 2004/0046288 A1 | 3/2004 | Chou |
| 6,964,793 | B2 | 11/2005 | Willson et al. | 2004/0065252 A1 | 4/2004 | Sreenivasan et al. |
| 6,965,506 | B2 | 11/2005 | Howald | 2004/0065976 A1 | 4/2004 | Sreenivasan et al. |
| 6,980,282 | B2 | 12/2005 | Choi et al. | 2004/0110856 A1 | 6/2004 | Young et al. |
| 6,982,783 | B2 | 1/2006 | Choi et al. | 2004/0118809 A1 | 6/2004 | Chou et al. |
| 6,986,975 | B2 | 1/2006 | Sreenivasan et al. | 2004/0131718 A1 | 7/2004 | Chou et al. |
| 6,990,870 | B2 | 1/2006 | Choi et al. | 2004/0137734 A1 | 7/2004 | Chou et al. |
| 7,019,819 | B2 | 3/2006 | Choi et al. | 2004/0141163 A1 | 7/2004 | Bailey et al. |
| 7,023,238 | B1 | 4/2006 | Camarota | 2004/0149367 A1 | 8/2004 | Olsson et al. |
| 7,036,389 | B2 | 5/2006 | Choi et al. | 2004/0149687 A1 | 8/2004 | Choi et al. |

| | | | |
|---|---|---|---|
| 2004/0156108 A1 | 8/2004 | Chou et al. | |
| 2004/0163563 A1 | 8/2004 | Sreenivasan et al. | |
| 2004/0168613 A1 | 9/2004 | Nguyen et al. | |
| 2004/0192041 A1 | 9/2004 | Jeong et al. | |
| 2004/0197843 A1 | 10/2004 | Chou et al. | |
| 2004/0201890 A1 | 10/2004 | Crosby | |
| 2004/0250945 A1 | 12/2004 | Zheng et al. | |
| 2005/0037143 A1 | 2/2005 | Chou et al. | |
| 2005/0046449 A1 | 3/2005 | Davis | |
| 2005/0056963 A1 | 3/2005 | McCutcheon | |
| 2005/0061773 A1 | 3/2005 | Choi et al. | |
| 2005/0072757 A1 | 4/2005 | McMackin et al. | |
| 2005/0106321 A1 | 5/2005 | McMackin et al. | |
| 2005/0146078 A1 | 7/2005 | Chou et al. | |
| 2005/0160934 A1 | 7/2005 | Xu et al. | |
| 2005/0189676 A1 | 9/2005 | Sreenivasan | |
| 2005/0236739 A1 | 10/2005 | Willson et al. | |
| 2005/0260295 A1 | 11/2005 | Choi et al. | |
| 2005/0263077 A1 | 12/2005 | GanapathiSubramanian et al. | |
| 2005/0264132 A1 | 12/2005 | Choi et al. | |
| 2005/0264134 A1 | 12/2005 | GanapathiSubramanian et al. | |
| 2005/0266587 A1 | 12/2005 | Nimmakayala et al. | |
| 2005/0270312 A1 | 12/2005 | Lad et al. | |
| 2005/0274219 A1 | 12/2005 | Choi et al. | |
| 2005/0275251 A1 | 12/2005 | Choi et al. | |
| 2005/0275311 A1 | 12/2005 | Choi et al. | |
| 2005/0276919 A1 | 12/2005 | Truskett et al. | |
| 2005/0284886 A1 | 12/2005 | Penciu | |
| 2006/0005657 A1 | 1/2006 | Choi et al. | |
| 2006/0017876 A1 | 1/2006 | Watts | |
| 2006/0062867 A1 | 3/2006 | Choi et al. | |
| 2006/0063112 A1 | 3/2006 | Sreenivasan | |
| 2006/0068120 A1 | 3/2006 | Sreenivasan et al. | |
| 2006/0076717 A1 | 4/2006 | Sreenivasan et al. | |
| 2006/0077374 A1 | 4/2006 | Sreenivasan et al. | |
| 2006/0113697 A1 | 6/2006 | Sreenivasan | |
| 2006/0115999 A1 | 6/2006 | Sreenivasan et al. | |
| 2006/0121728 A1 | 6/2006 | McMackin et al. | |
| 2006/0131785 A1 | 6/2006 | Sewell | |
| 2006/0145398 A1 | 7/2006 | Bailey et al. | |
| 2006/0172031 A1 | 8/2006 | Babbs et al. | |
| 2006/0172549 A1 | 8/2006 | Choi et al. | |
| 2006/0172553 A1 | 8/2006 | Choi et al. | |
| 2007/0063384 A1 | 3/2007 | Choi et al. | |
| 2007/0114686 A1 | 5/2007 | Choi et al. | |
| 2007/0126150 A1 | 6/2007 | GanapathiSubramanian et al. | |
| 2007/0126156 A1 | 6/2007 | Mahadevan et al. | |
| 2007/0132152 A1 | 6/2007 | Choi et al. | |
| 2007/0141271 A1 | 6/2007 | Xu et al. | |
| 2007/0190200 A1 | 8/2007 | Cherala et al. | |
| 2007/0228589 A1 | 10/2007 | Choi et al. | |
| 2007/0228593 A1 | 10/2007 | Jones et al. | |
| 2007/0228609 A1 | 10/2007 | Sreenivasan et al. | |
| 2007/0228610 A1 | 10/2007 | Sreenivasan et al. | |
| 2007/0231422 A1 | 10/2007 | Cherala et al. | |
| 2007/0231981 A1 | 10/2007 | Sreenivasan et al. | |
| 2007/0243655 A1 | 10/2007 | Schmid et al. | |
| 2007/0247608 A1 | 10/2007 | Sreenivasan et al. | |
| 2007/0287081 A1 | 12/2007 | Cherala et al. | |
| 2008/0141862 A1 | 6/2008 | Xu et al. | |
| 2008/0153312 A1 | 6/2008 | Sreenivasan et al. | |
| 2008/0174046 A1 | 7/2008 | Choi et al. | |
| 2008/0199816 A1 | 8/2008 | Choi et al. | |
| 2008/0204693 A1 | 8/2008 | Nimmakayala et al. | |

FOREIGN PATENT DOCUMENTS

| | | |
|---|---|---|
| EP | 0398589 | 4/1998 |
| FR | 2677043 A1 | 12/1992 |
| JP | 3-32888 | 2/1981 |
| JP | 57-032629 | 2/1982 |
| JP | 57-153434 | 9/1982 |
| JP | 58-129074 | 8/1983 |
| JP | 60-127935 | 7/1985 |
| JP | 1-96749 | 8/1989 |
| JP | 02-24848 | 1/1990 |
| JP | 02-92603 | 4/1990 |
| JP | 02192045 | 7/1990 |
| JP | 4-70379 | 5/1992 |
| JP | 4-148549 | 5/1992 |
| JP | 1-206007 | 8/1998 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | 01/42858 A1 | 6/2001 |
| WO | WO 01/47003 | 6/2001 |
| WO | WO-0140875 A1 * | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |
| WO | WO-03090985 A1 * | 11/2003 |
| WO | 03/099463 A2 | 12/2003 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 11, 1999.

Colburn et al., Step and Flash Imprint Lithography: A New Approach to High-Resolution Patterning, Proc. Of SPIE, vol. 3676 Mar. 1, 1999.

Wu, Large Area High Density Quantized Magnetic Disks Fabricated Using Nanoimprint Lithography, J. Vac. Sci. Technol. B 16(6), pp. 3825-3829 Nov. 1, 1998.

Gokan et al., Dry Etch Resistance of Organic Materials, J. Electrochem. Soc.: Solid-State Science and Technology, pp. 143-146 Jan. 1, 1983.

Chou, Nanoimprint Lithography and Lithographically Induced Self-Assembly, MRS Bulletin, pp. 512-517 Jul. 1, 2001.

Braeuer et al., Precise Polymer Micro-Optical Systems, MRS Bulletin, pp. 519-522 Jul. 1, 2001.

Choi et al., Design of Orientation Stages for Step and Flash Imprint Lithography, Precision Engineering, pp. 192-199 Jan. 1, 2001.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Feldman, Wafer Chuck for Magnification Correction in X-ray Lithography, J. Vac. Sci. Technol. B 16(6), pp. 3476-3479 Nov. 1, 1998.

Xia et al., Soft Lithography, Annu Rev. Mater Sci. 1998 28: 153-184 Jan. 1, 1998.

Chou et al., Imprint of Sub-25 nm Vias and Trenches in Polymers, Appl. Phys. Lett. 67 (21) Nov. 20, 1995.

Otto et al., Characterization and Application of a UV-based Imprint Technique, Microelectronic Engineering 57-58, pp. 361-366 Jan. 1, 2001.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457, Jan. 1, 2000.

Chou et al., Imprint Lithography with 25-Nanometer Resolution, Science vol. 272, pp. 85-87, Apr. 5, 1996.

Heidari, Nanoimprint Lithography at the 6 in. Wafer Scale, J. Vac. Sci. Technol. B 18(6), pp. 3557-3560, Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Otto et al., Reproducibility and Homogeneity in Step and Repeat UV-Nanoimprint Lithography, Microelectronic Engineering 73-74, pp. 152-156, Jan. 1, 2004.

Kawata et al., Imprint/Photo Hybrid Litography Using Conventional Contact Aligner, Japanese Journal of Applied Physics, vol. 43, No. 6B, pp. 4027-4030, Jun. 29, 2004.

Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.

Abstract of Japanese Patent 58-129074, Aug. 1, 1983.

Chou et al., Ultrafast and Direct Imprint of Nanostructures in Silicon, Nature, Col. 417, pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Wilson et al., Lithography and Etch Issues, Handbook of Multilevel Metallization for Integrated Circuits, pp. 566-567, Jan. 1, 1993.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Park et al., Aligning Liquid Crystals Using Replicated Nanopatterns, PSI Scientific Report 2002, vol. VII, p. 85 Mar. 1, 2003.

McMackin et al., Design and Performance of a Step and Repeat Imprinting Machine, SPIE Microltihgraphy Conference Feb. 1, 2003.

Le et al., Development of an Etch-Definable Lift-Off Process for Use with Step and Flash Imprint Lithography, SPIE Microlithography Conference Feb. 1, 2005.

Cardinale et al., Fabrication of a Surface Acoustic Wave-Based Correlator Using Step-and-Flash Imprint Lithography, J. Vac. Sci. Technol. B 22(6) Nov. 1, 2004.

U.S. Appl. No. 11/303,777, naming Inventors Ganapthisubramanian et al., entitled Bifurcated Contact Printing Technique, filed Dec. 16, 2005.

Abstract of Japanese Patent 3-32888, Feb. 13, 1991.

Abstract of French Patent 2677043, Dec. 1, 1992.

Colburn et al., Dissertation for the Degree of Doctor of Philosophy, Step and Flash Imprint Lithography: A Low-Pressure, Room-Temperature Nanoimprint Lithography Aug. 1, 2001.

U.S. Appl. No. 11/565,350, naming Inventors Choi et al., entitled Method and System for Double-Sided Patterning of Substrates, filed Nov. 30, 2006.

U.S. Appl. No. 11/692,450, naming Inventors Sreenivasan et al., entitled Patterning a Plurality of Fields on a Substrate to Compensate for Differing Evaporation Times, filed Mar. 28, 2007.

U.S. Appl. No. 11/695,850, naming Inventors Sreenivasan et al., entitled Method of concurrently patterning a substrate having a plurality of fields and a plurality of alignment marks, filed Apr. 3, 2007.

U.S. Appl. No. 11/693,236, naming inventors Schmid et al., entitled Self-Aligned Process for Fabricating Imprint Templates Containing Variously Etched Features, filed Mar. 29, 2007.

U.S. Appl. No. 11/694,500, naming Inventors Sreenivasan et al., entitled Imprinting of Partial Fields at the Edge of the Wafer, filed Mar. 30, 2007.

Thurn et al., Stress Hysteresis and Mechanical Properties of Plasma-Enhanced Chemical Vapor Deposited Dielectric Films, Journal of Applied Physics, vol. 95, No. 3, pp. 967-976 Feb. 1, 2004.

Modreanu et al., Optical Properties of LPCVD Silicon Oxynitride, Thin Solid Films 337, pp. 82-84.

U.S. Appl. No. 11/749,909, naming Inventors Choi et al., entitled Method for Expelling Gas Positioned Between a Substrate and a Mold, filed May 17, 2007.

Abstract of Japanese Patent 4-148549.

Abstract of Japanese Patent 57-153434.

Abstract of Japanese Patent 57-032629.

U.S. Appl. No. 11/762,378, naming Inventors McMackin et al., entitled Imprint Lithography Template to Facilitate Control of Liquid Movement, filed Jun. 13, 2007.

U.S. Appl. No. 11/837,762, naming Inventors Nimmakayala et al., entitled Substrate Support Method, filed Aug. 13, 2007.

Abstract of Japanese Patent 60-127935.

U.S. Appl. No. 11/242,628, naming Inventors Meissl et al., entitled An Assembly and Method for Transferring Imprint Lithography Templates, filed Oct. 3, 2005.

Casey et al., Control of Metal Deposition in a Web Coater, Controlling in both Transverse and Machine Direction, Proceedings, Annual Technical Conference - Society of Vacuum Coaters May 4, 1990.

Lu et al., the Effect of Deposition Parameters on Performance of VME-FPC, Proceedings of the IEEE International Vacuum Microelectronics Conference, IVMC Aug. 16, 2001.

Abstract of Japanese patent 02-192045, Jul. 27, 1990.

Zeze et al., Reactive Ion Etching of Quartz and Pyrex for Microelectonic Applications, J.Appl. Phys. 92, 3624 (2002) Oct. 1, 2002.

Leech et al., Reactive Ion Etching of Quartz and Glasses for Microfabrication, SPIE 3680, 839 (1999) Mar. 1, 1999.

* cited by examiner

PATTERNING SUBSTRATES EMPLOYING MULTIPLE CHUCKS

CROSS-REFERENCE TO RELATED APPLICATIONS

The present application claims priority to U.S. Provisional Application No. 60/760,738, filed on Jan. 20, 2006, entitled "Apparatus for and Methods for Nano-Imprinting with Multi-Substrate Chucks" and U.S. Provisional Application No. 60/827,125, filed on Sep. 27, 2006, entitled "Apparatus and Method for Nano-Imprinting with Multi-Substrate Chucks" and U.S. Provisional Application No. 60/788,808, filed on Apr. 3, 2006, entitled "Residual Layer Thickness Measurement and Correction"; and is a Continuation-in-Part of U.S. patent application Ser. No. 11/565,350, filed on Nov. 30, 2006, entitled "Method and System for Double-Sided Patterning of Substrates" which claims priority to U.S. Provisional Application No. 60/748,430, filed on Dec. 8, 2005, entitled "Apparatus For and Methods For Imprinting, Aligning and Separation for Double Side Imprinting", all of which are incorporated herein by reference.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent application publication 2004/0065976 filed as U.S. patent application Ser. No. 10/264,960, entitled, "Method and a Mold to Arrange Features on a Substrate to Replicate Features having Minimal Dimensional Variability"; U.S. patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

DETAILED DESCRIPTION

Figure 1:
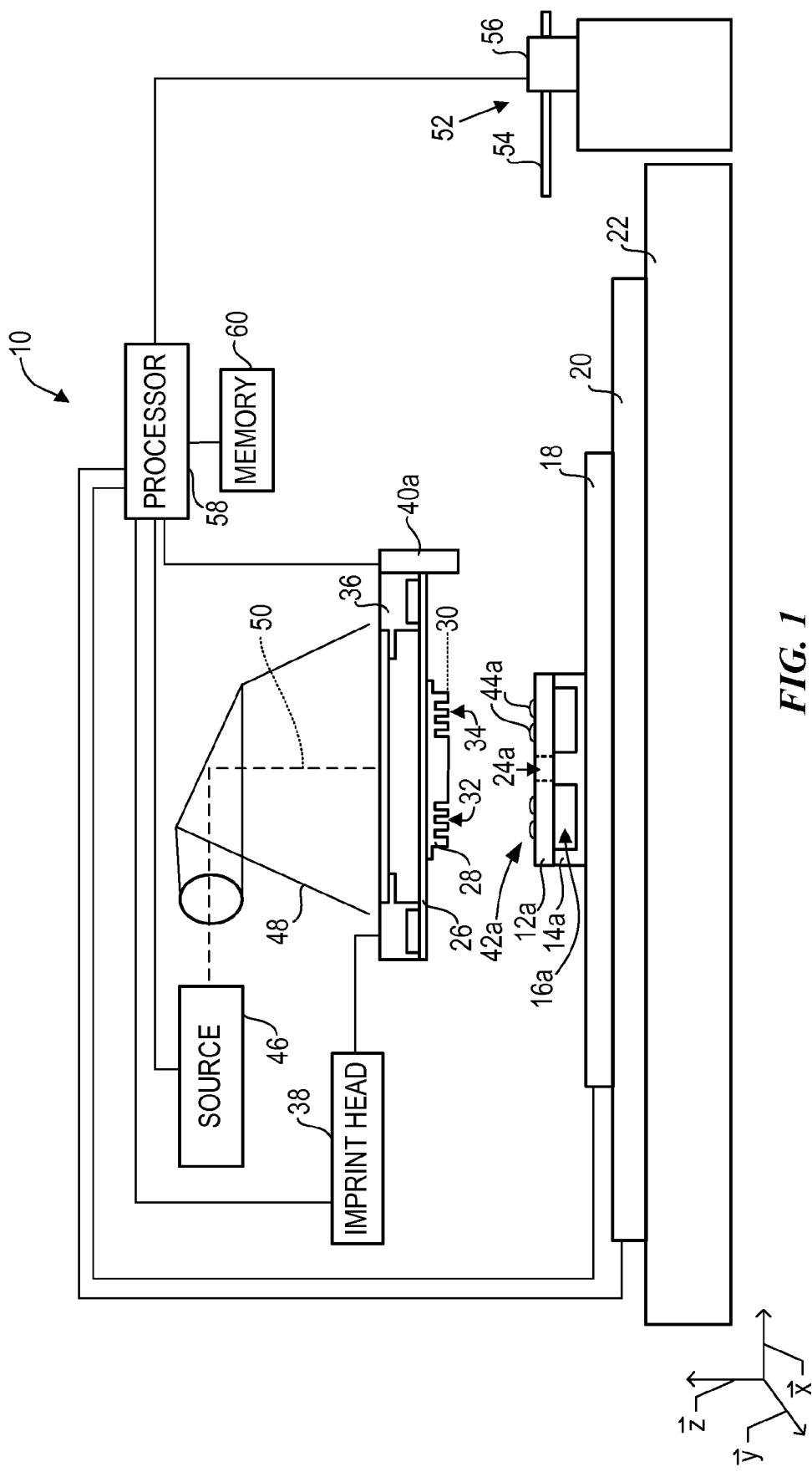
FIG. 1 is a simplified side view of a lithographic system having a mold spaced-apart from a substrate in accordance with the prior art.

Referring to FIG. 1, a system 10 is shown to form a relief pattern on a first substrate 12a. First substrate 12a may be coupled to a first substrate chuck 14a. First substrate chuck 12a may be any chuck including, but not limited to, vacuum, pin-type, groove type, or electromagnetic, as described in U.S. Pat. No. 6,873,087 entitled "High-Precision Orientation Alignment and Gap Control Stages for Imprint Lithography Processes" which is incorporated herein by reference. First substrate chuck 14a may comprise a cavity 16a facing first substrate 12a. First substrate 12a and first substrate chuck 14a may be supported on a first stage 18 and a second stage 20, with first stage 18 being positioned between first substrate chuck 14a and second stage 20. Further, first and second stages 18 and 20 may be positioned on a base 22. First stage 18 may provide motion about a first axis while second stage 20 may provide motion about a second axis, the second axis being orthogonal to the first axis, i.e. the first and second axes being the x and y axes. Exemplary stages in the present invention are available under part numbers XM200L350 and XM200S50, both from Newport Corporation of Irvine, Calif. First substrate 12a may further comprise a throughway 24a. However, in a further embodiment, first substrate 12a may be substantially absent of throughway 24a.

Spaced-apart from first substrate 12a is a template 26 having a mesa 28 extending therefrom towards first substrate 12a with a patterning surface 30 thereon. Mesa 28 may also be referred to as a mold 28. Mesa 28 may also be referred to as a nanoimprint mold 28. In a further embodiment, template 26 may be substantially absent of mold 28. Template 26 and/or mold 28 may be formed from such material including but not limited to, fused-silica, quartz, silicon, organic polymers, siloxane polymers, borosilicate glass, fluorocarbon polymers, metal, and hardened sapphire. As shown patterning surface 30 comprises features defined by a plurality of spaced-apart recesses 32 and protrusions 34. However, in a further embodiment, patterning surface 30 may be substantially smooth and/or planar. Patterning surface 30 may define an original pattern that forms the basis of a pattern to be formed on first substrate 12a, described further below. Template 26 may be coupled to a template chuck 36, template chuck 36 being any chuck including, but not limited to, vacuum, pin-type, groove type, or electromagnetic, as described in U.S. Pat. No. 6,873,087 entitled "High-Precision Orientation Alignment and Gap Control Stages for Imprint Lithography Processes". Further, template chuck 36 may be coupled to an imprint head 38 to facilitate movement of template 26 and mold 28. In an example, imprint head 38 may be a three degree-of-freedom (two tilting motions and one translational motion) stage controlled by a three-voice coil actuators (not shown) or other linear actuators (not shown).

System 10 further comprises a first fluid dispenser 40a. First fluid dispenser 40a may be in fluid communication with first substrate 12a so as to position a polymeric material 42a thereon, described further below. As shown first fluid dispenser 40a is coupled to template chuck 36; however, in a further embodiment, first fluid dispenser 40a may be coupled to any part of system 10, i.e., template 26 or imprint head 38. Further, system 10 may comprise any number of fluid dispensers and first fluid dispenser 40a may comprise a plurality of dispensing units therein. Exemplary fluid dispensers in the present invention are available under the part name Leopard from Xaar Corporation located in Cambridge, United Kingdom.

Polymeric material 42a may be positioned upon first substrate 12a using any known technique, e.g., drop dispense, spin-coating, dip coating, thin film deposition, thick film deposition, and the like. As shown, polymeric material 42a may be positioned upon first substrate 12a as a plurality of spaced-apart droplets 44a. In an example, each droplet of droplets 44a may have a unit volume of approximately 6 pico-liters. Typically, polymeric material 42a may be positioned upon first substrate 12a before the desired volume is defined between mold 28 and first substrate 12a, described further below. However, polymeric material 42a may fill the volume after the desired volume has been obtained.

System 10 further comprises a source 46 of energy 48 to direct energy 48 along a path 50. Imprint head 38 and first and second stages 18 and 20 are configured to arrange mold 28 and first substrate 12a, respectively, to be in superimposition and disposed within path 50, described further below. Either imprint head 38, first and second stages 18 and 20, or a combination of the above, may vary a distance between mold 28 and first substrate 12a to define a desired volume therebetween that is filled by polymeric material 42a. In an example, source 46 may be a He lamp or He/Xe lamp or LED based source that may emit UV in the range of 300 to 380 nm.

Figure 2:
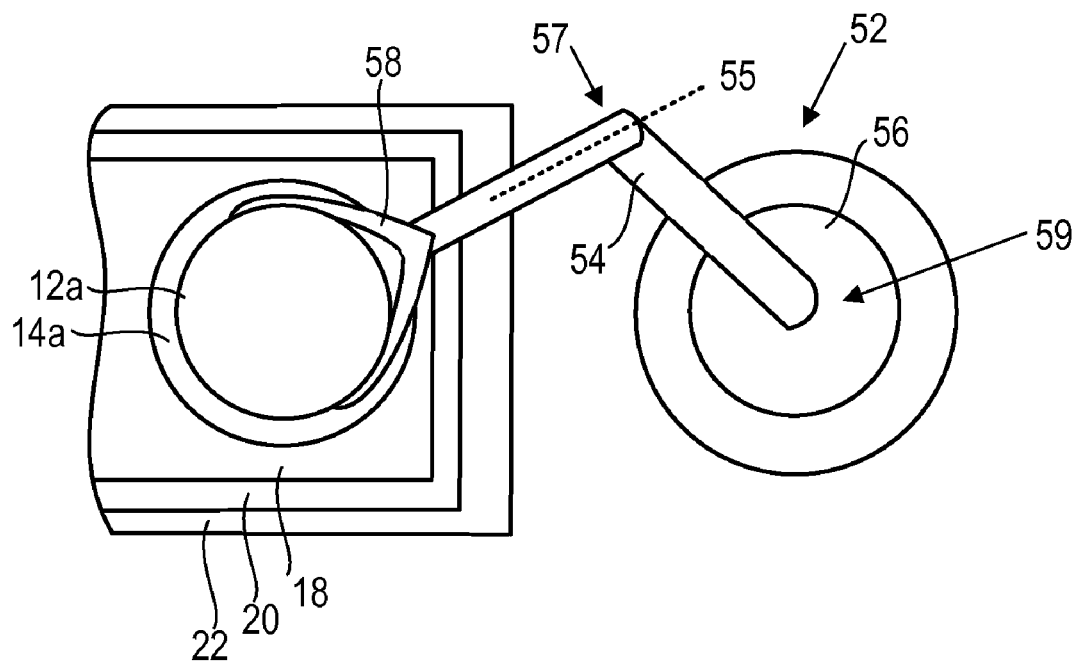
FIG. 2 is a top down view of a robot handling the substrate shown in FIG. 1.

Referring to FIGS. 1 and 2, system 10 further comprises a robot 52 for positioning first substrate 12a upon and removing first substrate 12a from first substrate chuck 14a. Robot 52 may be any handling robot known in the art. In an example, robot 52 comprises an arm 54 coupled to a driving means 56. Arm 54 further has an end effecter 58 coupled thereto to handle first substrate 12a. In an example, end effecter 58 may be an edge-gripping or thin air cavity chuck to hold substrate 12a without contacting an area of first substrate 12a having polymeric material 42a positioned thereon, respectively, i.e., the active area of substrate 12a. Driving means 56 many extend or contract arm 54, move arm 54 horizontally in a circle, or provide any desired motion of arm 54. Driving means 56 may also provide motion about the first and second axes mentioned above. Driving means 56 may also rotate about its axis, i.e., about a joint 59. Arm 54 may also rotate about an axis 55 to flip first substrate 12a 180° with respect to mold 28, described further below. Further, arm 54 may rotate about a joint 57. Furthermore, robot 52 may transport first substrate 12a between first substrate chuck 14a and a substrate cassette (not shown). The substrate cassette (not shown) may comprise a plurality of substrates therein.

Referring to FIG. 1, system 10 may be regulated by a processor 58 that is in data communication with first and second stages 18 and 20, imprint head 38, first fluid dispenser 40a, source 46, and robot 52, operating on a computer readable program stored in memory 60.

Figure 3:
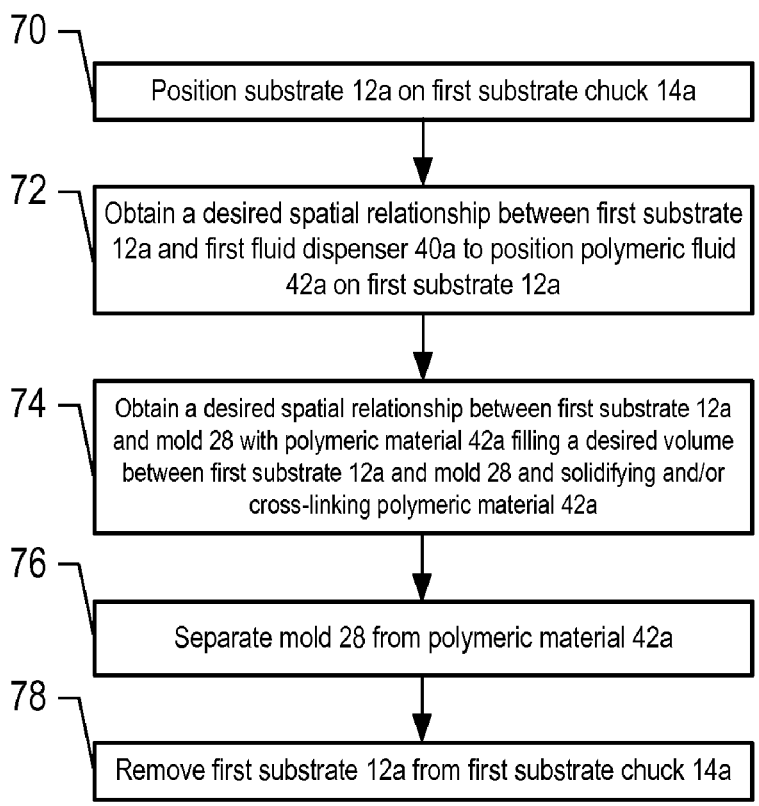
FIG. 3 is a flow diagram showing a method of patterning the substrate shown in FIG. 1.

Referring to FIGS. 1 and 3, in accordance with the prior art, a process flow for processing first substrate 12a is shown. At step 70, first substrate 12a may be positioned upon first substrate chuck 14a. More specifically, first and second stages 18 and 20 may position first substrate chuck 14a in a desired spatial relationship with respect to robot 52 such that robot 52 may position first substrate 12a upon first substrate chuck 14a. Robot 52 may transfer first substrate 12a from the substrate cassette (not shown) and position the same upon first substrate chuck 14a. At step 72, first and second stages 18 and 20 may translate first substrate 12a such that a desired position may be obtained between first substrate 12a and first fluid dispenser 40a. As a result, first fluid dispenser 40a may position polymeric material 42a upon first substrate 12a, as mentioned above. Polymeric material 42a may be a nanoimprint material.

At step 74, a desired spatial relationship may be obtained between first substrate 12a and mold 28. More specifically, first and second stages 18 and 20 and imprint head 38 may position first substrate chuck 14a such that first substrate 12a may be in superimposition with mold 28 and further polymeric material 42a fills the desired volume between first substrate 12a and mold 28. To facilitate filling of recessions 32, before contact between mold 28 and droplets 44a, the atmosphere between mold 28 and droplets 44a may be saturated with helium or is completely evacuated or is a partially evacuated atmosphere of helium. Further, at step 74, after the desired volume is filled with polymeric material 42a, source 46 may produce energy 48, e.g., broadband ultraviolet radiation that causes first polymeric material 42a to solidify and/or cross-link conforming to a shape of first substrate 12a and patterning surface 30 of mold 28.

At step 76, mold 28 may be separated from polymeric material 42a positioned on first substrate 12a. At step 78, first substrate 12a may be unloaded from first substrate chuck 14a. More specifically, first and second stages 18 and 20 may position first substrate 12a in a desired spatial relationship to robot 52 such that robot 52 may remove first substrate 12a from first substrate chuck 14a and position the same within the substrate cassette (not shown).

To that end, in an example, the aforementioned process for patterning first substrate 12a may have a total process time per substrate of thirty-four (34) seconds. More specifically, the time for each step of the aforementioned patterning process is shown more clearly in Chart 1:

CHART 1

| | Process for patterning a substrate | Process time (secs) |
|---|---|---|
| 1 | Position first substrate 12a on first substrate chuck 14a | 7 |
| 2 | Obtain a desired spatial relationship between first substrate 12a and first fluid dispenser 40a to position polymeric material 42a on first substrate 12a | 1 |
| 3 | Obtain a desired spatial relationship between first substrate 12a and mold 28 with polymeric material 42a filling a desired volume between first substrate 12a and mold 28 and solidifying and/or cross-linking polymeric material 42a | 18 |
| 4 | Separate mold 28 from polymeric material 42a | 1 |
| 5 | Remove first substrate 12a from first substrate chuck 14a | 7 |
| | Total/Substrate | 34 |

To that end, the steps for the aforementioned method of processing first substrate 12a may be performed sequentially. As a result, a portion of system 10 may not be operating at full capacity, i.e., a portion of system 10 may remain idle with respect to the remaining portions of system 10. More specifically, the steps of 1) positioning first substrate 12a on first substrate chuck 14a (step 1); 2) obtaining a desired spatial relationship between first substrate 12a and mold 28 with polymeric material 42a filling a desired volume between first substrate 12a and mold 28 and solidifying and/or cross-linking polymeric material 42a (step 3); and 3) removing first substrate 12a from first substrate chuck 14a (step 5) comprise a majority of the process time to process first substrate 12a. As a result, inter alia, imprint head 38 and/or template 26 and/or mold 28 and/or robot 52 may be not be operating at full capacity, i.e., remain idle for periods of time, which may be undesirable. To that end, to maximize an efficiency of system 10, an optimization of the aforementioned method of patterning a substrate may be desired, and more specifically, an optimization of steps 1, 3, and 5 may be desired. As a result, a total increase in throughput of processing multiple substrates (and similarly, a decrease in total process time per substrate) may be obtained, which may be desirable. To that end, described below are a system and a method of processing multiple substrates concurrently.

Figure 4:
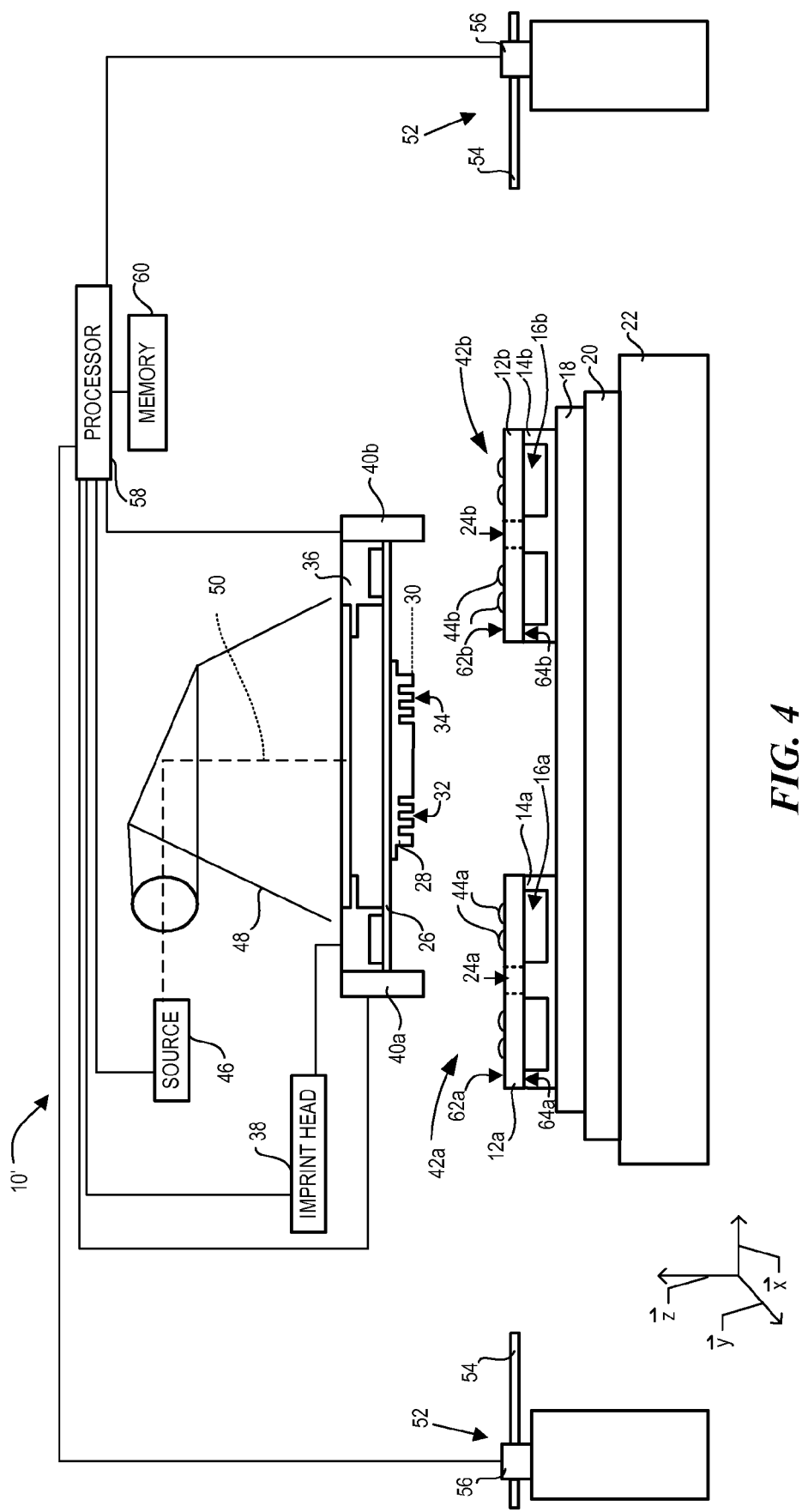
FIG. 4 is a simplified side view of a lithographic system having a mold spaced-apart from first and second substrates positioned on first and second substrate chucks, respectively.

Referring to FIG. 4, in a first embodiment, a system 10' is shown. System 10' may be analogous to that as system 10 described above with respect to FIG. 1, however, system 10' may comprise a second substrate 12b coupled to a second substrate chuck 14b. Second substrate 12b and second substrate chuck 14b may be analogous to that of first substrate 12a and first substrate chuck 14a, respectively, as described above with respect to FIG. 1. Second substrate chuck 14b may comprise a cavity 16b facing second substrate 12b. Second substrate 12b and second substrate chuck 14b may be supported on first and second stages 18 and 20. Second substrate 12b may further comprise a throughway 24b. However, in a further embodiment, second substrate 12b may be substantially absent of throughway 24b.

System 10' further comprises a second fluid dispenser 40b, analogous to that of first fluid dispenser 40a. As shown, second fluid dispenser 40b is coupled to template chuck 36; however, in a further embodiment, second fluid dispenser 40b may be coupled to any part of system 10, i.e. template 24 or imprint head 38. Control of second fluid dispenser 40b may be regulated by processor 58 that is in communication with second fluid dispenser 40b. Please note for simplicity of illustration, robot 52 is shown as two separate bodies and coupling between processor 58 and first and second stages 18 and 20 is not shown.

Figure 5:
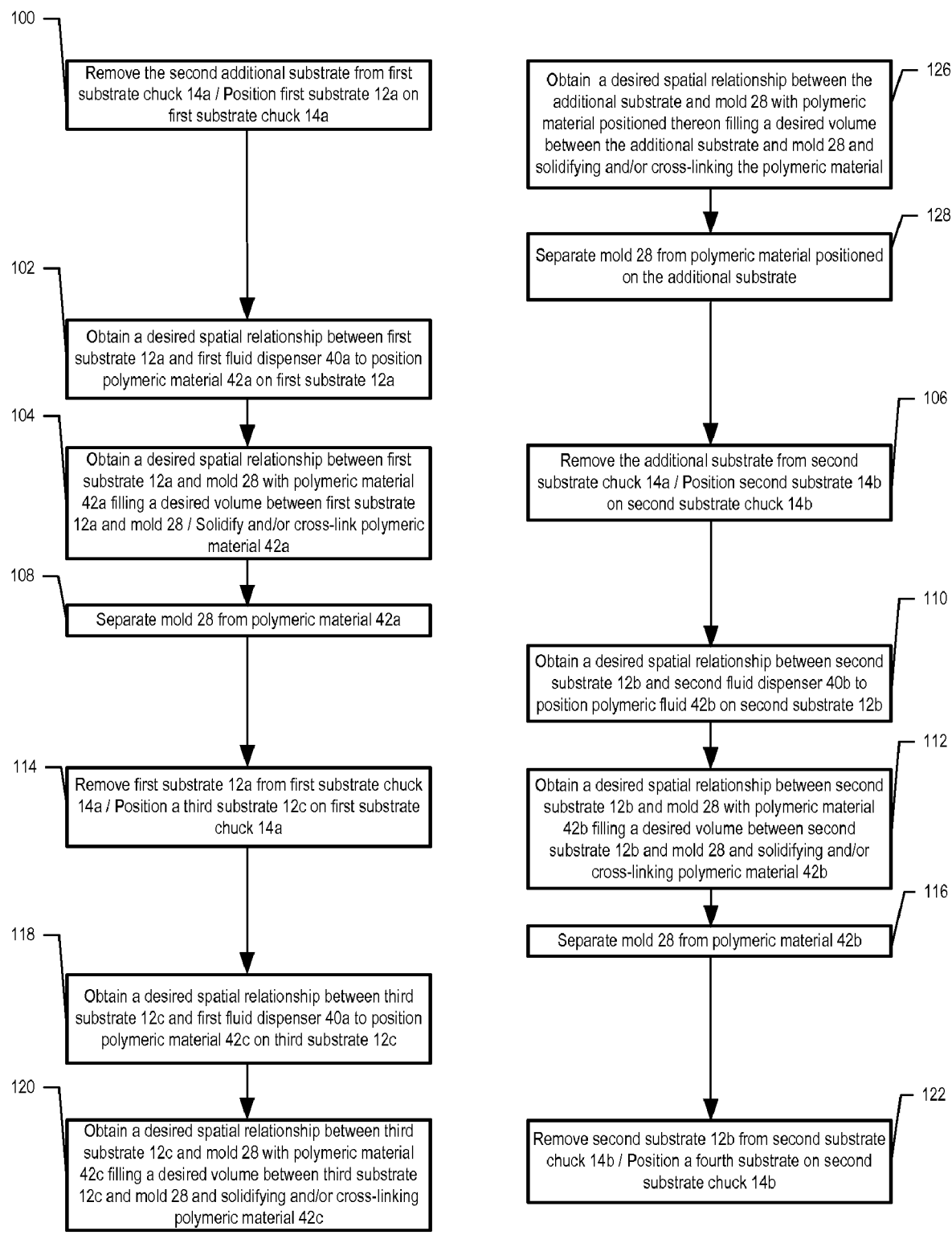
FIG. 5 is a flow diagram showing a method of patterning the first and second substrate shown in FIG. 4.
Figure 6:
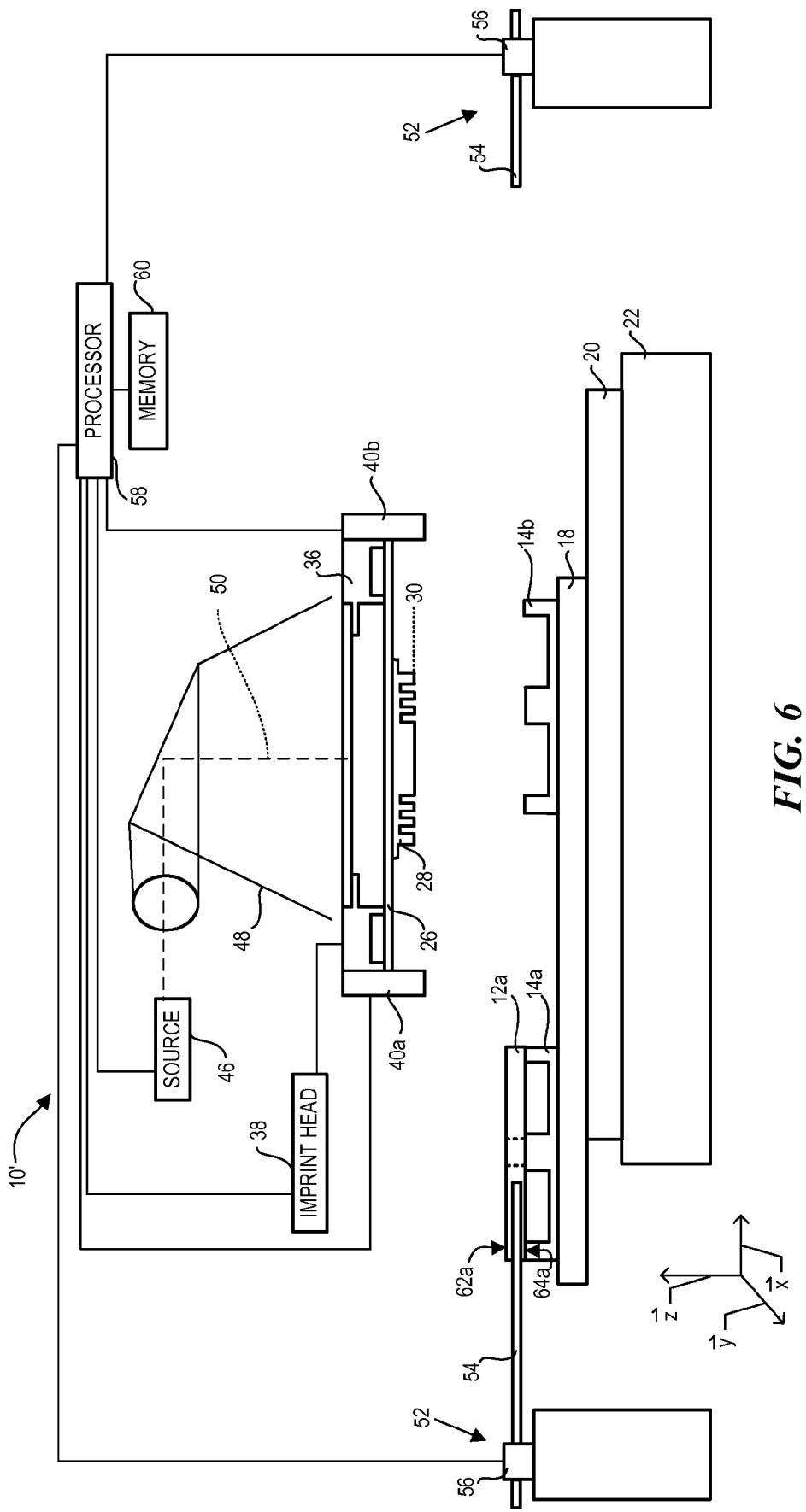
FIG. 6 is a simplified side view of the lithographic system shown in FIG. 4, with the robot positioning the first substrate on the first substrate chuck.

Referring to FIGS. 5 and 6, a process flow for processing first and second substrates 12a and 12b is shown. At step 100, first substrate 12a may be positioned upon first substrate chuck 14a. More specifically, first and second stages 18 and 20 may position first substrate chuck 14a in a desired spatial relationship with respect to robot 52 such that robot 52 may position first substrate 12a upon first substrate chuck 14a. Robot 52 may transfer first substrate 12a from the substrate cassette (not shown) and position the same upon first substrate chuck 14a.

Figure 7:
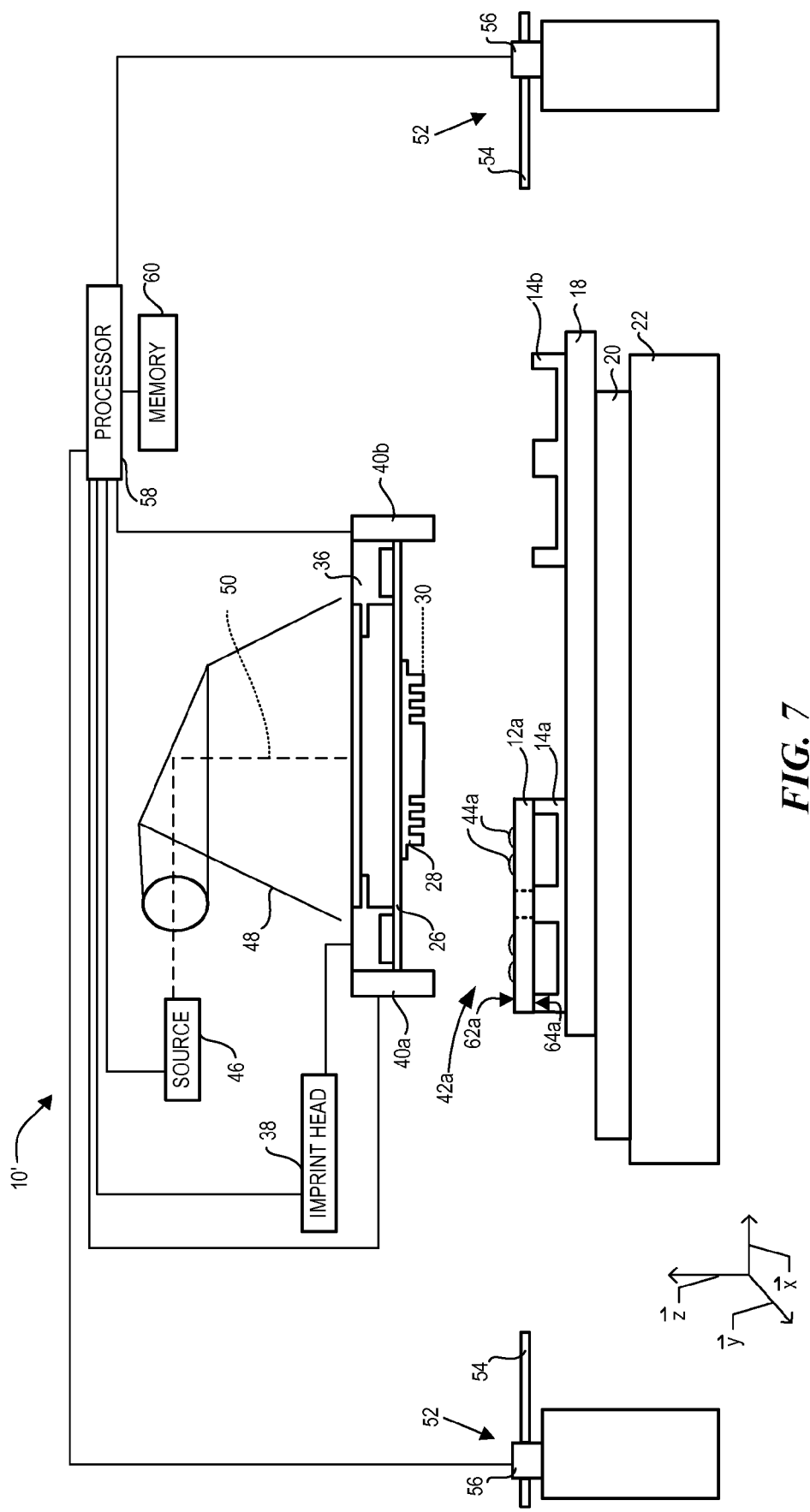
FIG. 7 is a simplified side view of the lithographic system shown in FIG. 6, with the first substrate having a material positioned thereon.

Referring to FIGS. 5 and 7, at step 102, first and second stages 18 and 20 may translate first substrate chuck 14a such that a desired position may be obtained between first substrate 12a and first fluid dispenser 40a to position polymeric material 42a on first substrate 12a.

Figure 8:
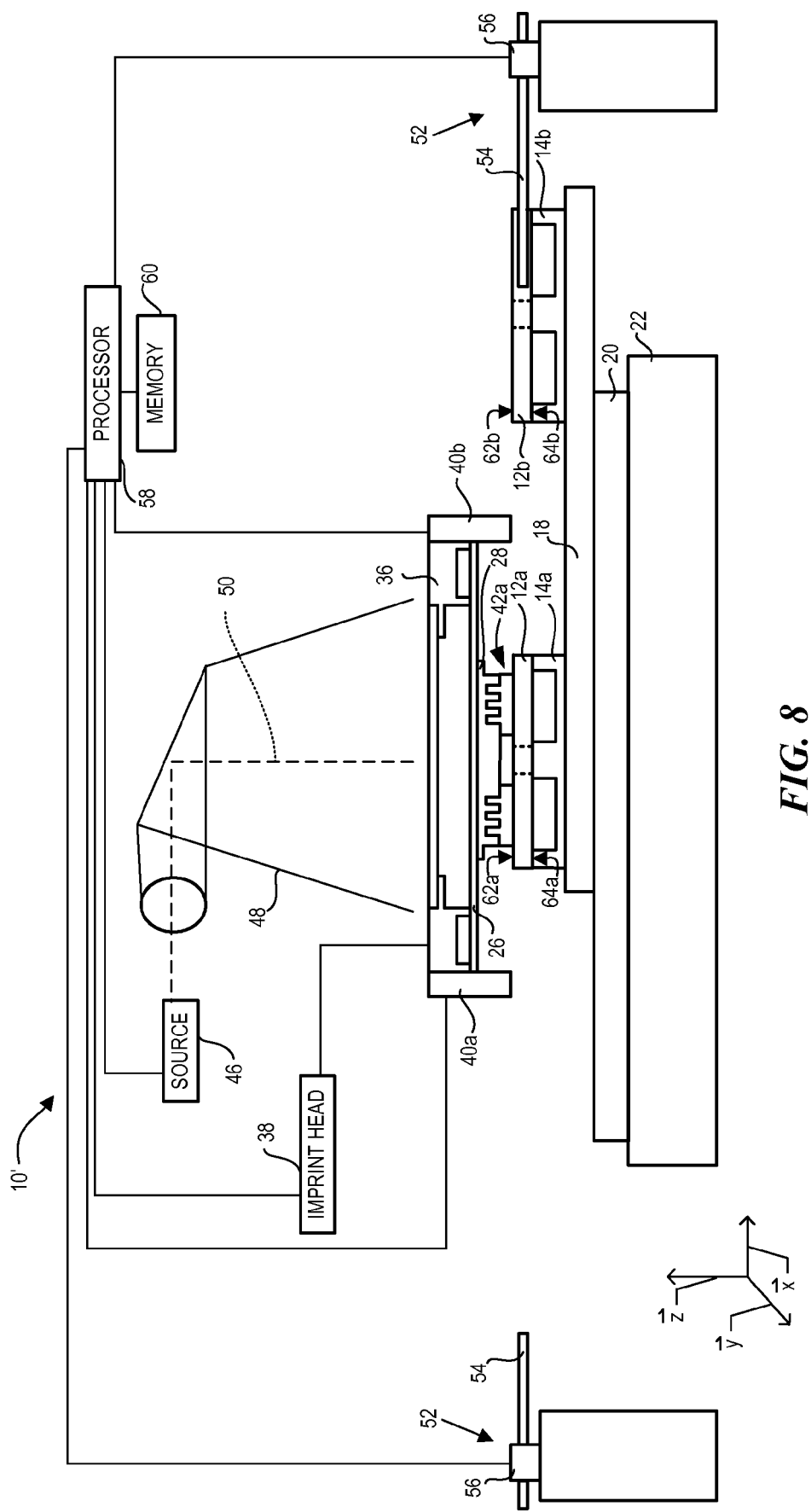
FIG. 8 is a simplified side view of the lithographic system shown in FIG. 7, with the mold contacting the material positioned on the first substrate and the robot positioning the second substrate on the second substrate chuck.

Referring to FIGS. 5 and 8, at step 104, a desired spatial relationship may be obtained between first substrate 12a and mold 28. More specifically, first and second stages 18 and 20 and imprint head 38 may position first substrate chuck 14a such that first substrate 12a may be in superimposition with mold 28 and further polymeric material 42a fills the desired volume between first substrate 12a and mold 28. Further, at step 104, after the desired volume is filled with polymeric material 42a, source 46 may produce energy 48, e.g., broadband ultraviolet radiation that causes polymeric material 42a to solidify and/or cross-link conforming to a shape of first substrate 12a and patterning surface 30 of mold 28. To that end, processing of second substrate 12b may occur concurrently with processing of first substrate 12a. More specifically, at step 106, concurrently with step 104, robot 52 may transfer second substrate 12b from the substrate cassette (not shown) and position the same upon second substrate chuck 14b.

Figure 9:
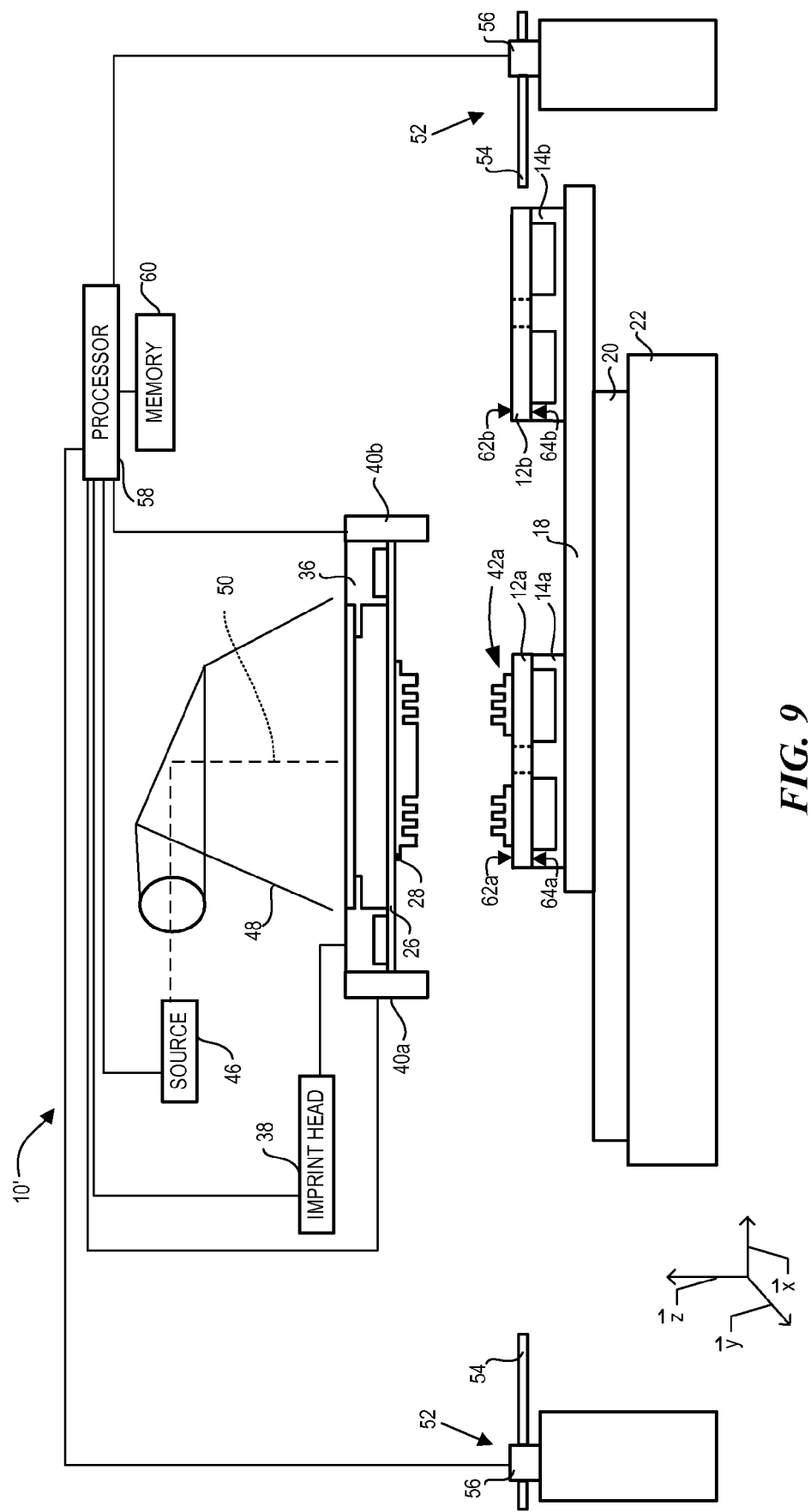
FIG. 9 is a simplified side view of the lithographic system shown in FIG. 8, with the mold being separated from the material on the first substrate.

Referring to FIGS. 5 and 9, at step 108, mold 28 may be separated from polymeric material 42a positioned on first substrate 12a. In a further embodiment, step 108 may occur concurrently with step 104 and step 106.

Figure 10:
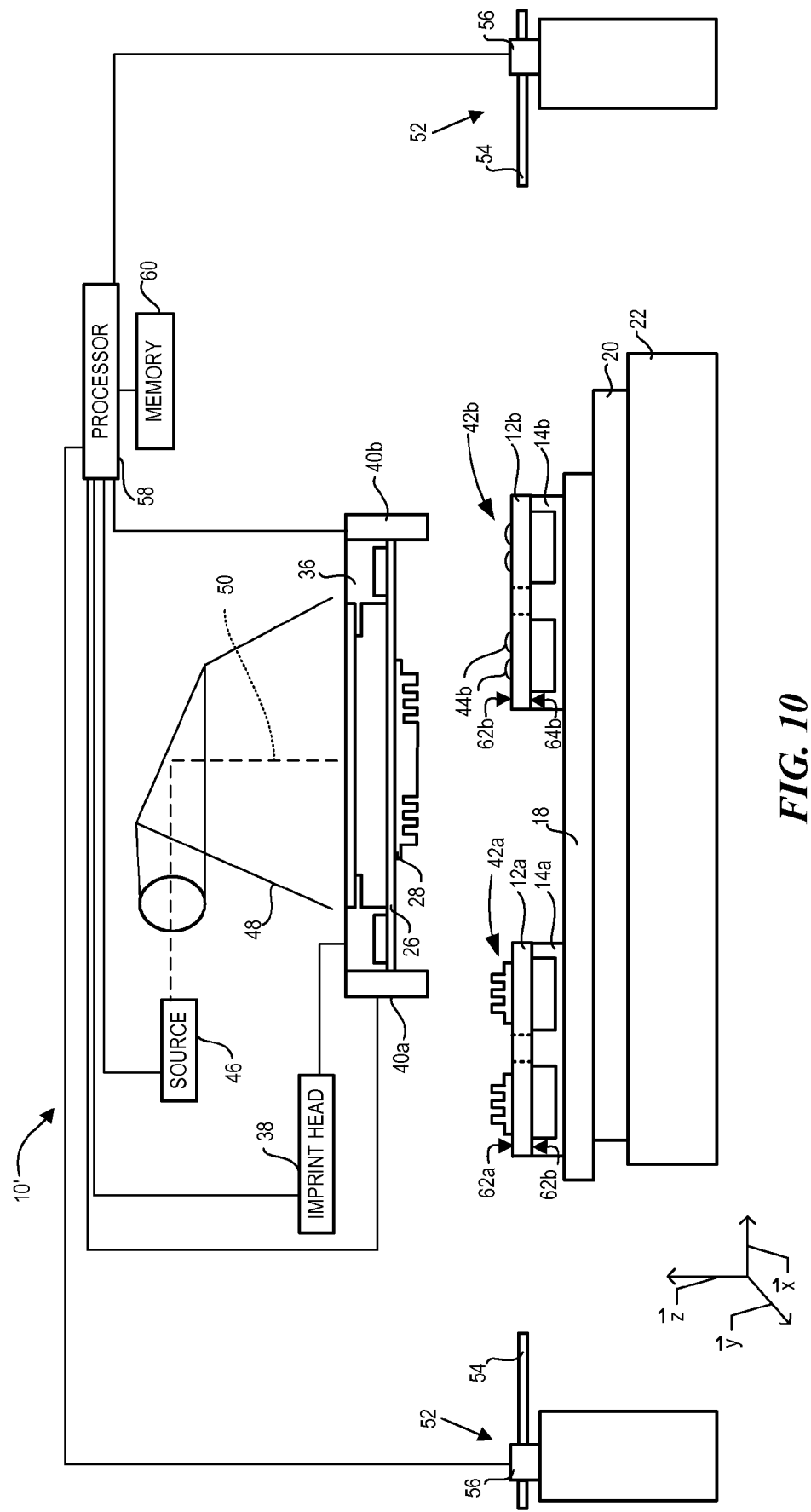
FIG. 10 is a simplified side view of the lithographic system shown in FIG. 9, with the second substrate having a material positioned thereon.

Referring to FIGS. 5 and 10, at step 110, first and second stages 18 and 20 may translate second substrate chuck 14b such that a desired position may be obtained between second substrate 12b and second fluid dispenser 40b to position polymeric material 42b on second substrate 12b. As shown polymeric material 42b may be positioned upon second substrate 12b as a plurality of spaced-apart droplets 44b.

Figure 11:
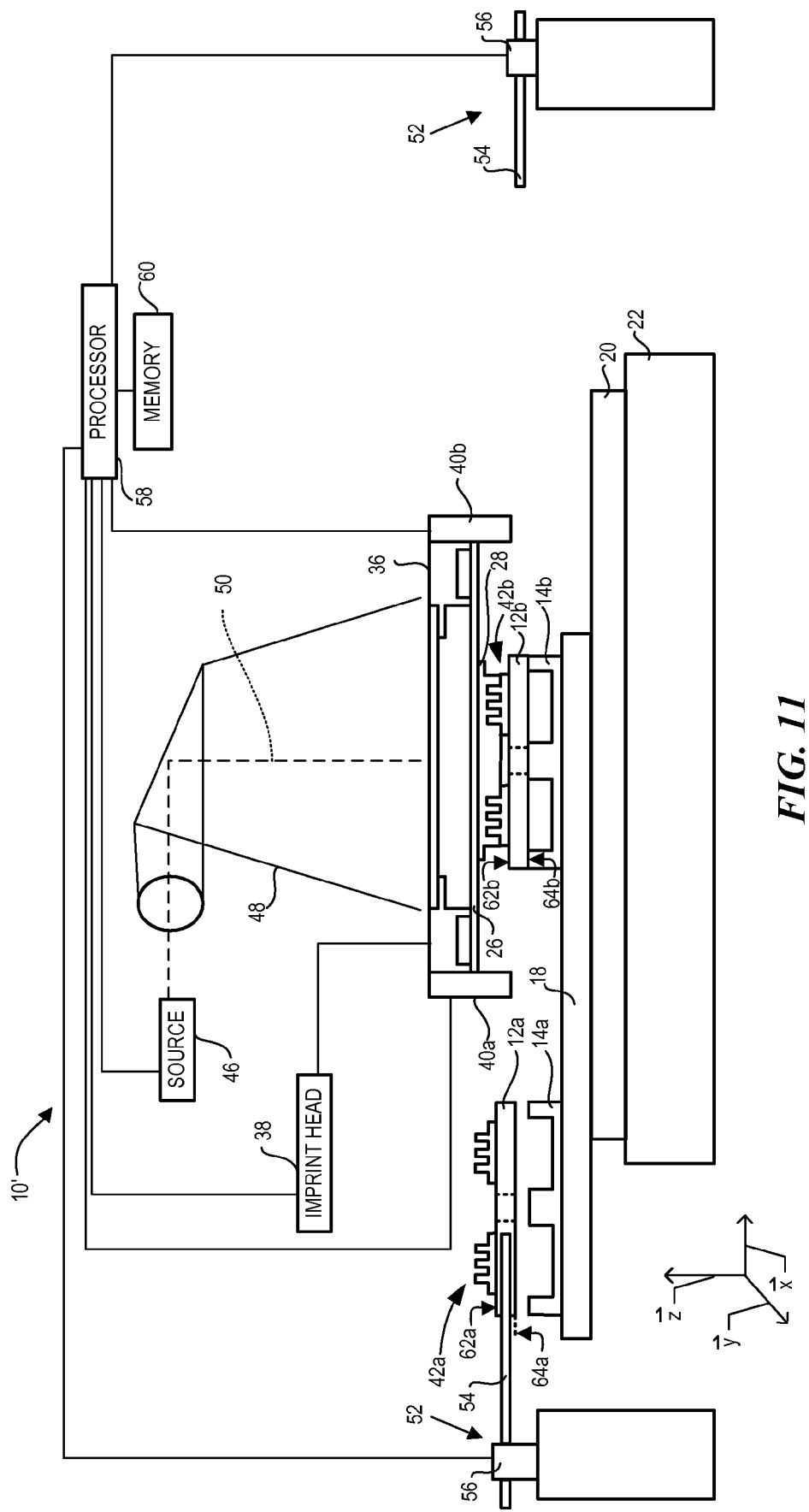
FIG. 11 is a simplified side view of the lithographic system shown in FIG. 10, with the mold contacting the material positioned on the second substrate and the robot removing the first substrate from the first substrate chuck.

Referring to FIGS. 5 and 11, at step 112, a desired spatial relationship may be obtained between second substrate 12b and mold 28. More specifically, first and second stages 18 and 20 and imprint head 38 may position second substrate chuck 14b such that second substrate 12b may be in superimposition with mold 28 and further polymeric material 42b fills the desired volume between second substrate 12b and mold 28. Further, at step 112, after the desired volume is filled with polymeric material 42b, source 46 may produce energy 48, e.g., broadband ultraviolet radiation that causes polymeric material 42b to solidify and/or cross-link conforming to a shape of second substrate 12b and patterning surface 30 of mold 28. At step 114, concurrently with step 112, robot 52 may remove first substrate 12a from first substrate chuck 14a and position the same within the substrate cassette (not shown) and further robot 52 may position a third substrate 12c, shown in FIG. 12, upon first substrate chuck 14a. Robot 52 may transfer third substrate 12c, shown in FIG. 12, from the substrate cassette (not shown) and position the same upon first substrate chuck 14a.

Figure 12:
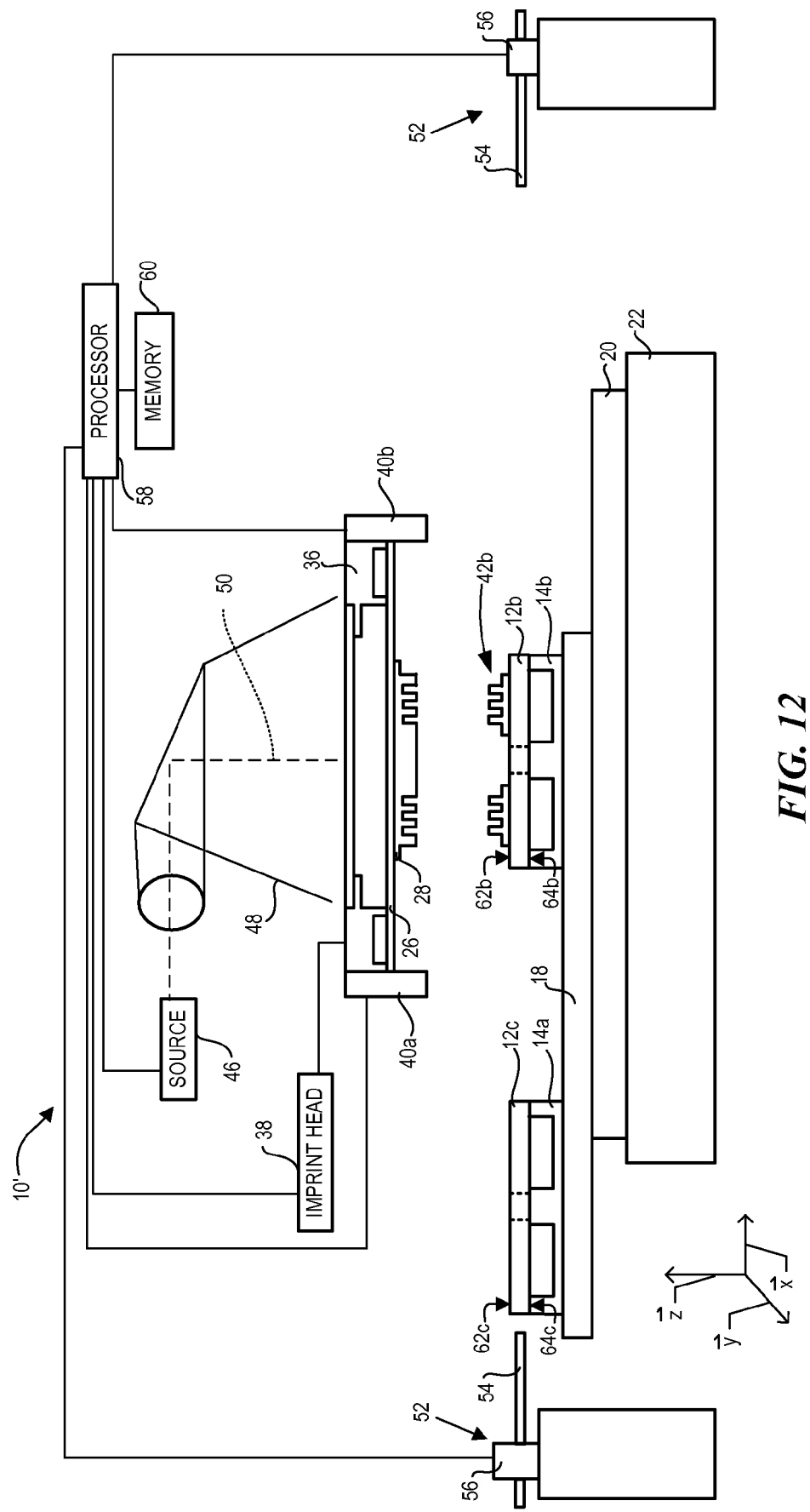
FIG. 12 is a simplified side view of the lithographic system shown in FIG. 11, with the mold being separated from the material on the second substrate and a third substrate positioned on the first substrate chuck.

Referring to FIGS. 5 and 12, at step 116, mold 28 may be separated from polymeric material 42b positioned on second substrate 12b. In a further embodiment, step 116 may occur concurrently with step 112 and step 114.

Figure 13:
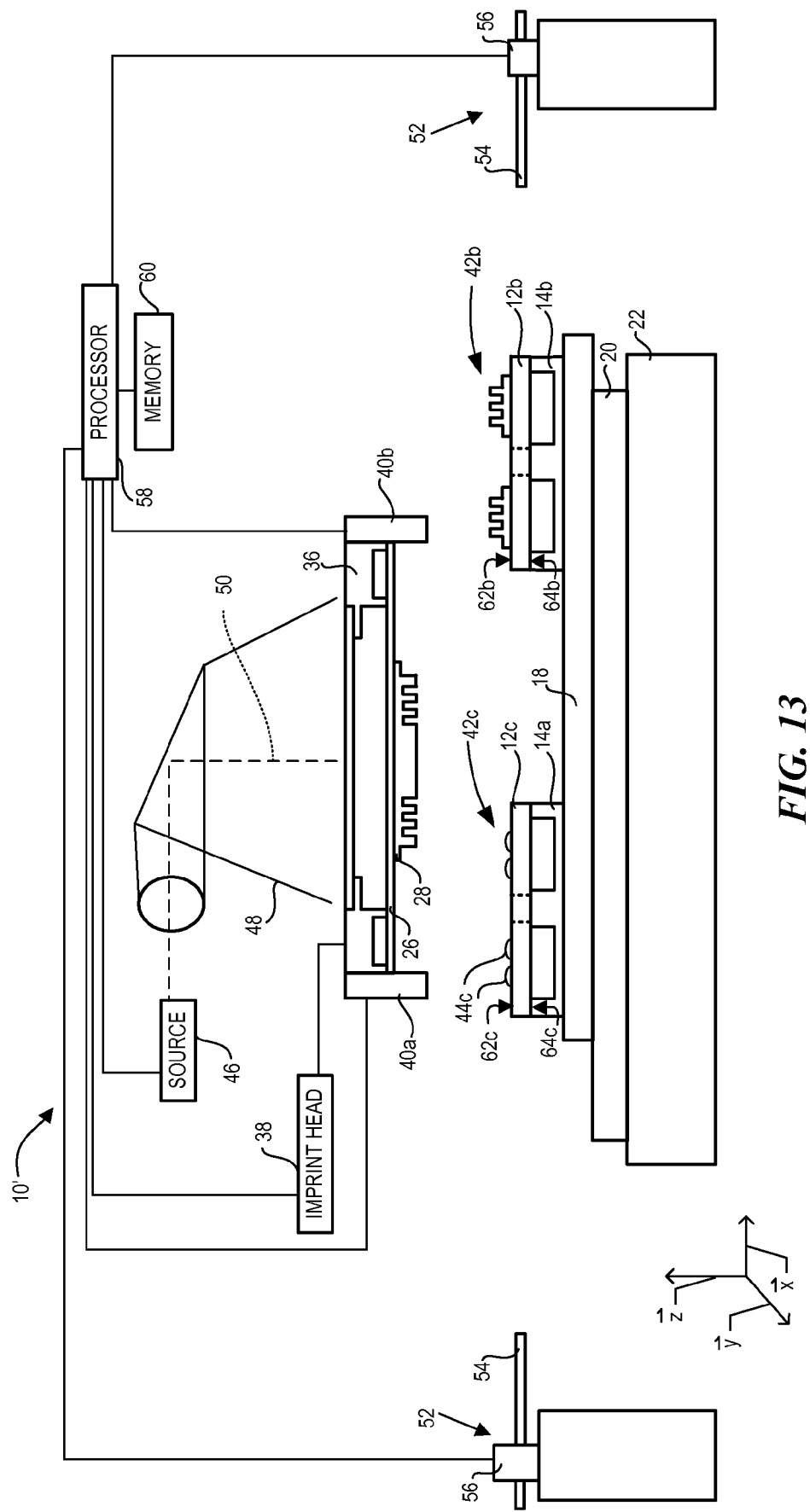
FIG. 13 is a simplified side view of the lithographic system shown in FIG. 12, with the third substrate having a material positioned thereon.

Referring to FIGS. 5 and 13, at step 118, first and second stages 18 and 20 may translate third substrate 12c such that a desired position may be obtained between third substrate 12c and first fluid dispenser 40a to position polymeric material 42c on third substrate 12c. As shown polymeric material 42c may be positioned upon third substrate 12c as a plurality of spaced-apart droplets 44c.

Figure 14:
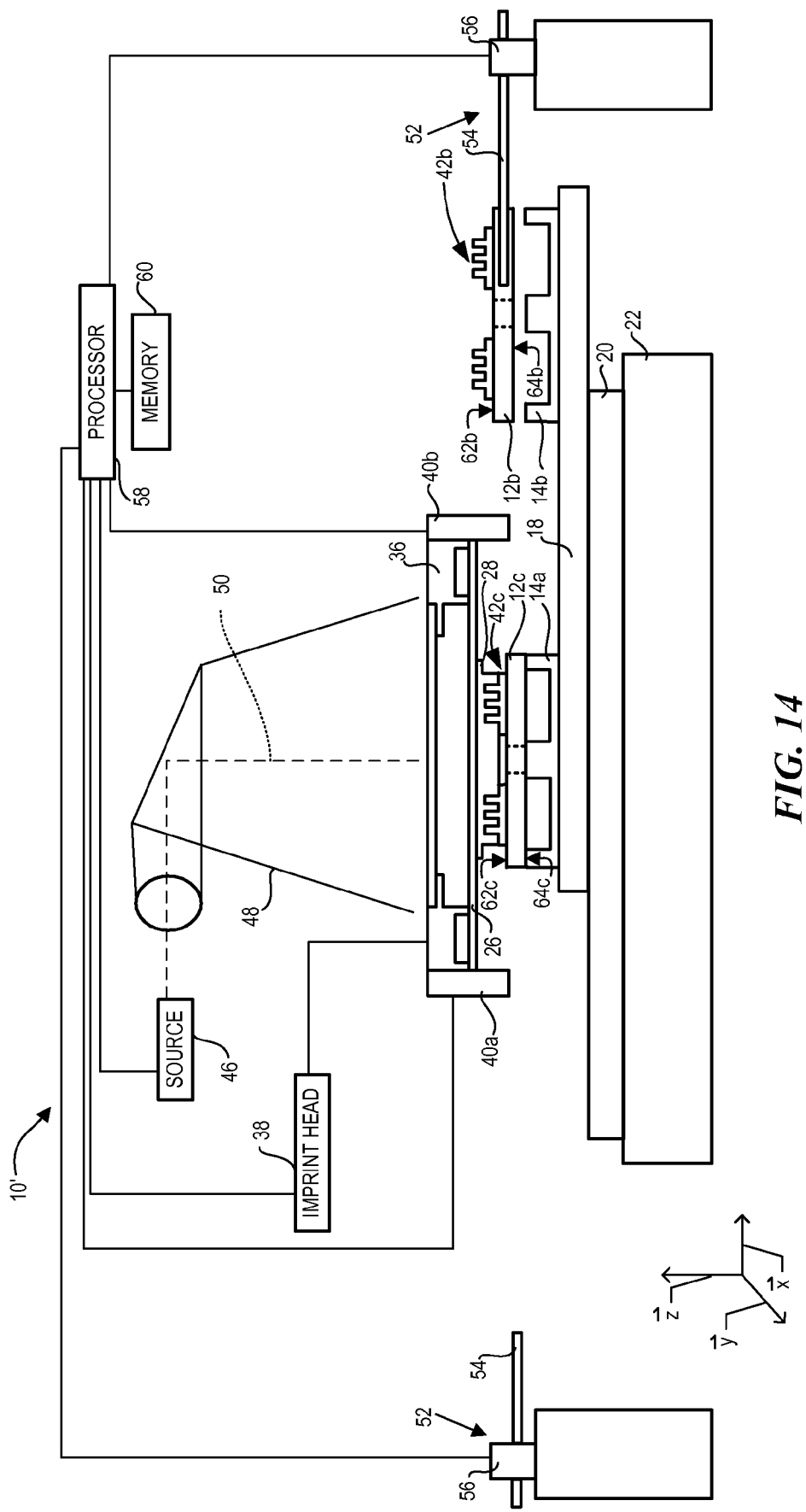
FIG. 14 is a simplified side view of the lithographic system shown in FIG. 13, with the mold contacting the material positioned on the third substrate and the robot removing the second substrate from the second substrate chuck.

Referring to FIGS. 5 and 14, at step 120, a desired spatial relationship may be obtained between third substrate 12c and mold 28. More specifically, first and second stages 18 and 20 and imprint head 38 may position first substrate chuck 14a such that third substrate 12c may be in superimposition with mold 28 and further polymeric material 42c fills the desired volume between third substrate 12c and mold 28. Further, at step 120, after the desired volume is filled with polymeric material 42c, source 46 may produce energy 48, e.g., broadband ultraviolet radiation that causes polymeric material 42c to solidify and/or cross-link conforming to a shape of third substrate 12c and patterning surface 30 of mold 28. At step 122, concurrently with step 120, robot 52 may remove second substrate 12b from second substrate chuck 14b and position the same within the substrate cassette (not shown) and further robot 52 may position a fourth substrate (not shown) upon second substrate chuck 14b. Robot 52 may transfer the fourth substrate (not shown) from the substrate cassette (not shown) and position the same upon second substrate chuck 14b. Third substrate 12c and the fourth substrate (not shown), both analogous to that of first substrate 12a, may be subjected to the aforementioned processing conditions, analogous to that of first and second substrates 12a and 12b.

Referring to FIGS. 4 and 5, furthermore, concurrently with patterning first substrate 12a, an additional substrate (not shown) may be patterned on second substrate chuck 14b prior to patterning of second substrate 12b. More specifically, at step 126, concurrently with step 100, the additional substrate (not shown), previously positioned on second substrate chuck 14b and having a polymeric material (not shown) positioned thereon, may have a pattern formed thereon analogous to that of step 112 shown in FIG. 11. Further, at step 128, mold 28 may be separated form the polymeric material (not shown) positioned on the additional substrate (not shown), analogous to that of step 116 shown in FIG. 12. To that end, step 106 may further include removing the additional substrate (not shown), analogous to that of step 122 shown in FIG. 14. Furthermore, step 100 may also further include removing a second additional substrate (not shown), previously patterned and positioned on first substrate chuck 14a prior to first substrate 12a, analogous to that of step 114 shown in FIG. 11.

In a further embodiment, first and second fluid dispensers 40a and 40b may be positioned outside of system 110, with first and second substrates 12a and 12b having polymeric material 42a and 42b, respectively, positioned thereon outside of system 110. In still a further embodiment, positioning of polymeric material 42a and 42b upon first and second substrate 12a and 12b may be optional.

To that end, in an example, the aforementioned patterning process for first and second substrates 12a and 12b may have a total process time per substrate of twenty (20) seconds. More specifically, the time for each step of the aforementioned patterning process is shown more clearly in Chart 2:

CHART 2

| | First substrate 12a | Second substrate 12b | Process Time (sec) |
|---|---|---|---|
| 1 | Remove the second additional substrate 12a from first substrate chuck 14a/ Position first substrate 12a on first substrate chuck 14a | Obtain a desired spatial relationship between an additional substrate and mold 28 with polymeric material positioned thereon filling a desired volume between the additional substrate and mold 28 and solidifying and/or cross-linking the polymeric material/Separate mold 28 from polymeric material 42b | 19 |
| 2 | Obtain a desired spatial relationship between first substrate 12a and first fluid dispenser 40a to position polymeric material 42a on first substrate 12a | | 1 |
| 3 | Obtain a desired spatial relationship between first substrate 12a and mold 28 with polymeric material 42a filling a desired volume between first substrate 12a and mold 28 and solidifying and/or cross-linking polymeric material 42a/ Separate mold 28 from polymeric material 42a | Remove the additional substrate 12b from second substrate chuck 14b/Position second substrate 12b on second substrate chuck 14b | 19 |
| 4 | | Obtain a desired spatial relationship between second substrate 12b and second fluid dispenser 40b to position polymeric material 42b on second substrate 12b | 1 |
| 5 | Remove first substrate 12a from first substrate chuck 14a/ Position a third substrate 12c on first substrate chuck 14a | Obtain a desired spatial relationship between second substrate 12b and mold 28 with polymeric material 42b filling a desired volume between second substrate 12b and mold 28 and solidifying and/or cross-linking polymeric material 42b/Separate mold 28 from polymeric material 42b | 19 |
| | Total/Substrate | | 20 |

To that end, the steps for the aforementioned method of processing first and second substrates 12a and 12b may be performed in parallel. More specifically, the steps of 1) positioning a substrate upon or removing a substrate from a substrate chuck and 2) obtaining a desired spatial relationship between the substrate and a mold with polymeric material filling a desired volume between the substrate and the mold and solidifying and/or cross-linking the polymeric material or separating the mold from the polymeric material occurs in parallel. As a result, a total increase in throughput of processing multiple substrates (and similarly, a decrease in total process time per substrate) may be obtained, which may be desirable.

Referring to FIG. 4, in a further embodiment, first and second stages 18 and 20 may rotate about a third axis extending orthogonal to first and second stages 18, i.e. the z axis, and may rotate for more than 180°.

Figure 15:
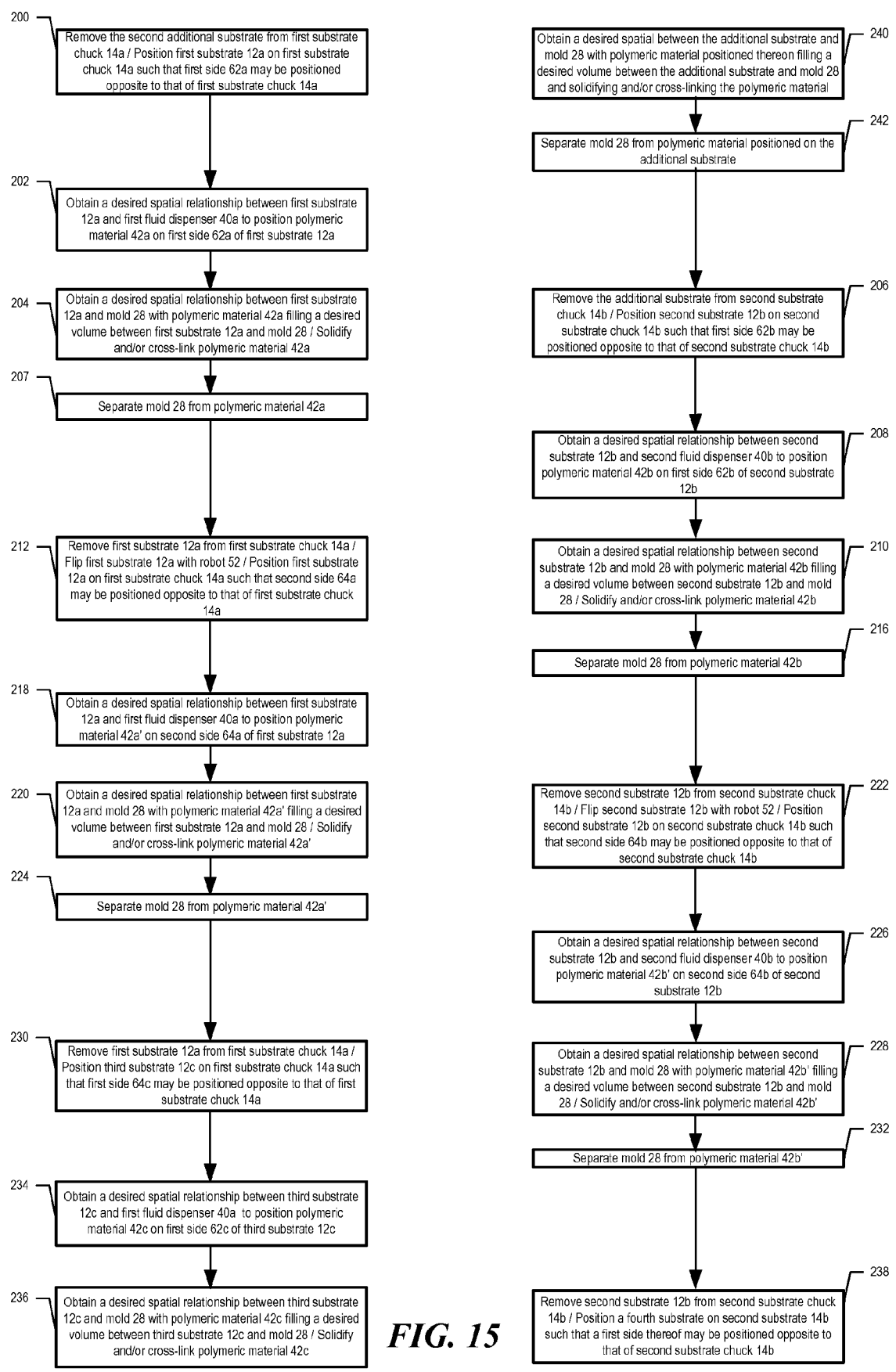
FIG. 15 is a flow diagram showing a method of patterning first and second sides of the first and second substrates shown in FIG. 4.

Referring to FIGS. 4 and 15, as mentioned above, the aforementioned method may be employed to form a pattern on first sides 62a and 62b of first and second substrates 12a and 12b, respectively. To that end, in a further embodiment, it may be desired to form a pattern on second sides 64a and 64b of first and second substrates 12a and 12b, respectively, with second sides 64a and 64b being positioned opposite to that of first and second sides 62a and 62b, respectively.

Referring to FIGS. 6 and 15, a process flow for processing first and second sides 62a and 64a of first substrate 12a and first and second sides 62b and 64b of second substrate 12b, shown in FIG. 4, is shown. This may be desirable in the area of patterned media imprinting. At step 200, first substrate 12 may be positioned upon first substrate chuck 14a. More specifically, first and second stages 18 and 20 may position first substrate chuck 14a in a desired spatial relationship with respect to robot 52 such that robot 52 may position first substrate 12a upon first substrate chuck 14a. Robot 52 may transfer first substrate 12a from the substrate cassette (not shown) and position the same upon first substrate chuck 14a such that first side 62a may be positioned opposite to that of first substrate chuck 14a.

Referring to FIGS. 7 and 15, at step 202, first and second stages 18 and 20 may translate first substrate 12a such that a desired position may be obtained between first substrate 12a and first fluid dispenser 40a to position polymeric material 42a on first side 62a of first substrate 12a.

Referring to FIGS. 8 and 15, at step 204, a desired spatial relationship may be obtained between first substrate 12a and mold 28. More specifically, first and second stages 18 and 20 and imprint head 38 may position first substrate chuck 14a such that first substrate 12a may be in superimposition with mold 28 and further polymeric material 42a fills the desired volume between first substrate 12a and mold 28. Further, at step 104, after the desired volume is filled with polymeric material 42a, source 46 may produce energy 48, e.g., broadband ultraviolet radiation that causes polymeric material 42a to solidify and/or cross-link conforming to a shape of first side 62a of first substrate 12a and patterning surface 30 of mold 28. To that end, processing of second substrate 12b may occur concurrently with processing of first substrate 12a. More specifically, at step 206, concurrently with step 204, robot 52 may transfer second substrate 12b from the substrate cassette (not shown) and position the same upon second substrate chuck 14b such that first side 62b may be positioned opposite to that of second substrate chuck 14b.

Referring to FIGS. 9 and 15, at step 207, mold 28 may be separated from polymeric material 42a positioned on first side 62a of first substrate 12a. In a further embodiment, step 207 may occur concurrently with step 204 and step 206.

Referring to FIGS. 10 and 15, at step 208, first and second stages 18 and 20 may translate second substrate 12b such that a desired position may be obtained between second substrate 12b and second fluid dispenser 40b to position polymeric material 42b on first side 62b of second substrate 12b. As shown polymeric material 42b, may be positioned upon second substrate 12b as a plurality of spaced-apart droplets 44b.

Figure 16:
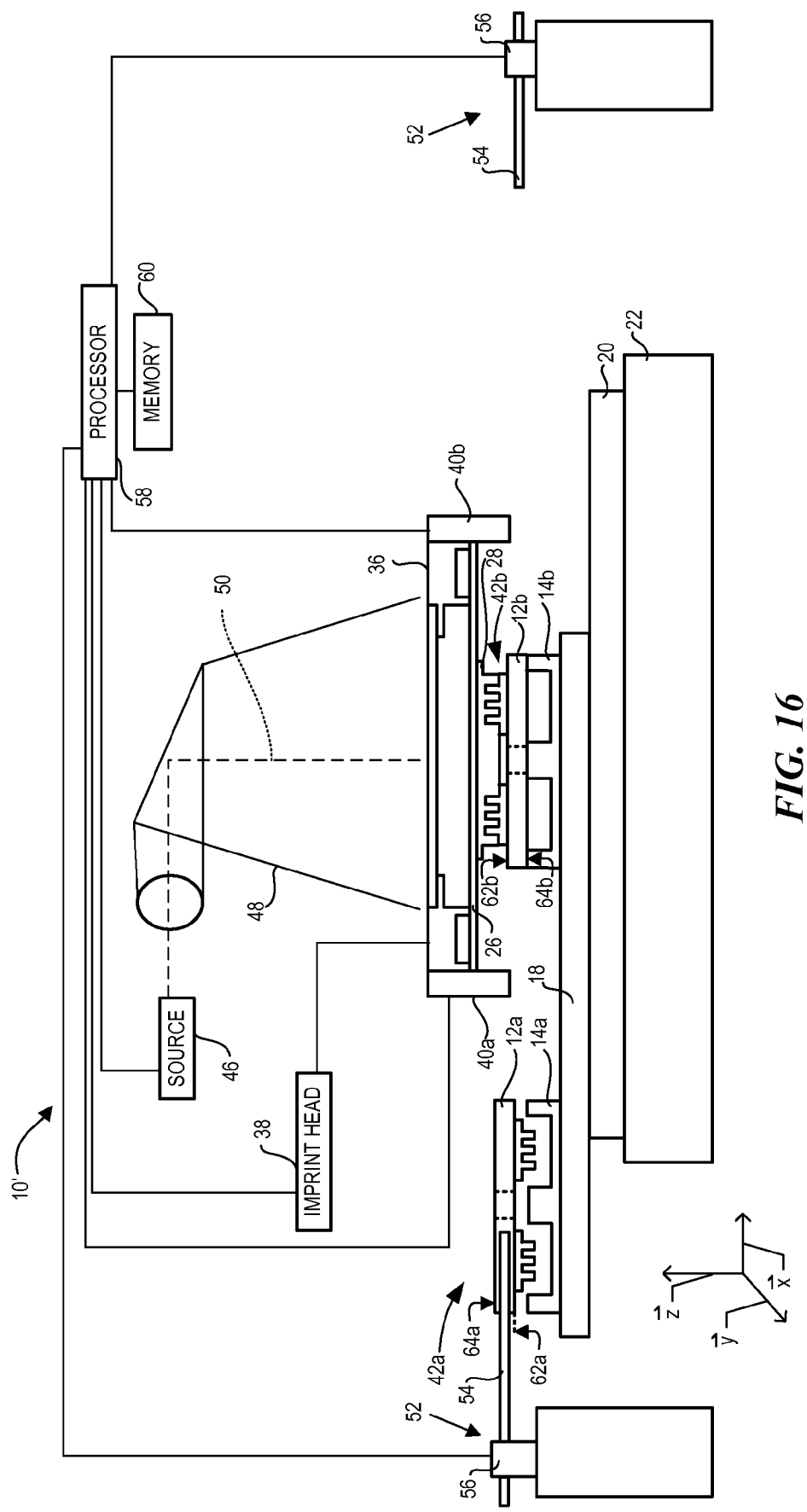
FIG. 16 is a simplified side diagram of the lithographic system shown in FIG. 10, with the mold contacting the material positioned on the second substrate and the robot flipping the first substrate with respect to the mold.
Figure 17:
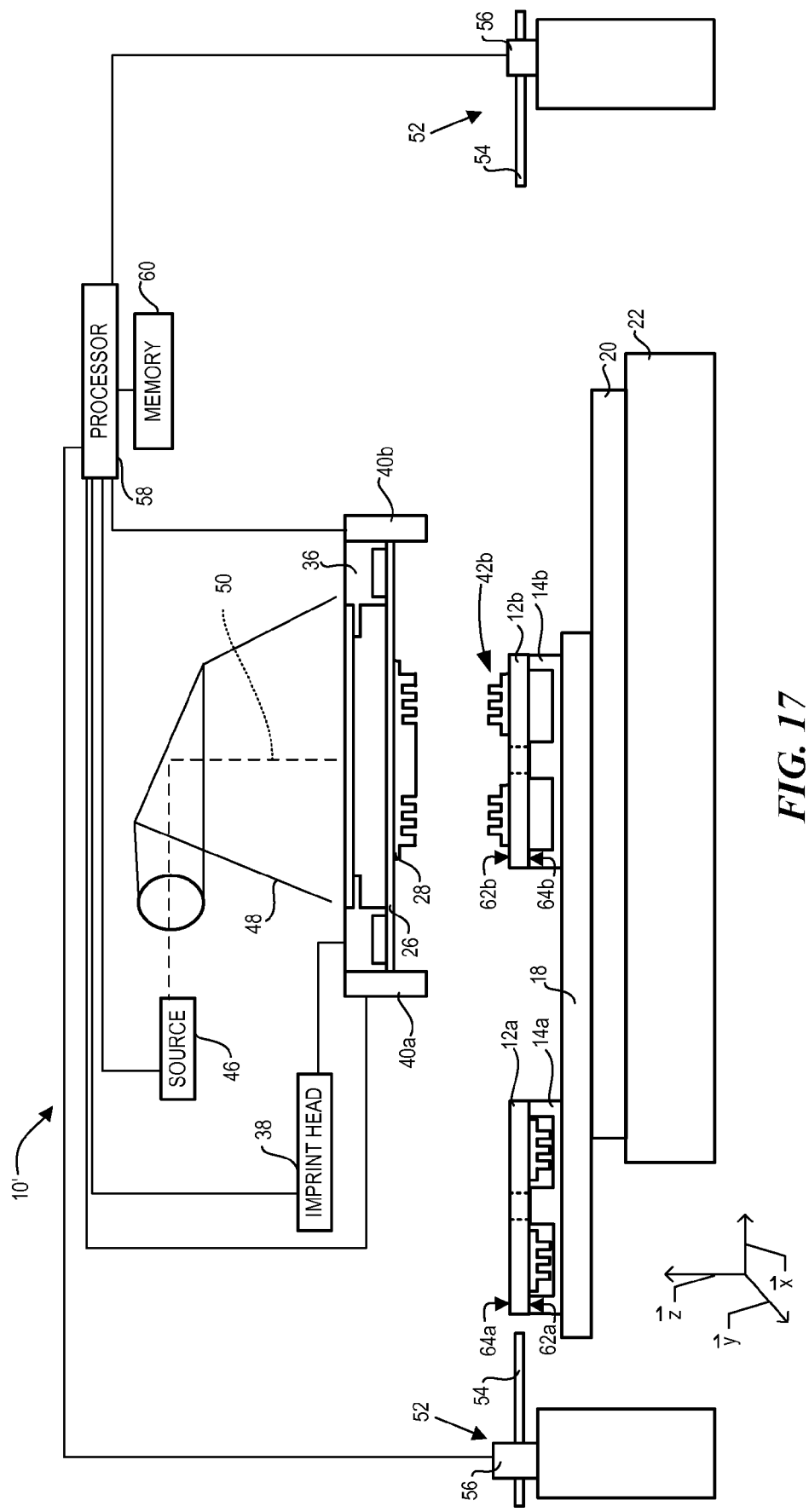
FIG. 17 is a simplified side view of the lithographic system shown in FIG. 16, with the mold being separated from the material on the second substrate and the first substrate positioned on the first substrate chuck in a second position.

Referring to FIGS. 15 and 16, at step 210, a desired spatial relationship may be obtained between second substrate 12b and mold 28. More specifically, first and second stages 18 and 20 and imprint head 38 may position second substrate chuck 14b such that second substrate 12b may be in superimposition with mold 28 and further polymeric material 42b fills the desired volume between second substrate 12b and mold 28. Further, at step 210, after the desired volume is filled with polymeric material 42b, source 46 may produce energy 48, e.g., broadband ultraviolet radiation that causes polymeric material 42b to solidify and/or cross-link conforming to a shape of first side 62b of second substrate 12b and patterning surface 30 of mold 28. At step 212, concurrently with step 210, robot 52 may remove first substrate 12a from first substrate chuck 14a and rotate arm 54 around its axis to flip first substrate 12a 180° with respect to mold 28 and further robot 52 may position first substrate 12a upon first substrate chuck 14a such that second side 64a may be positioned opposite to that of first substrate chuck 14a, as shown in FIG. 17. Furthermore, polymeric material 42a may be positioned within cavity 16a of first substrate chuck 14a to minimize, if not prevent, damage to polymeric material 42a.

Referring to FIGS. 15 and 17, at step 216, mold 28 may be separated from polymeric material 42b positioned on second substrate 12b. In a further embodiment, step 216 may occur concurrently with step 210 and step 212.

Figure 18:
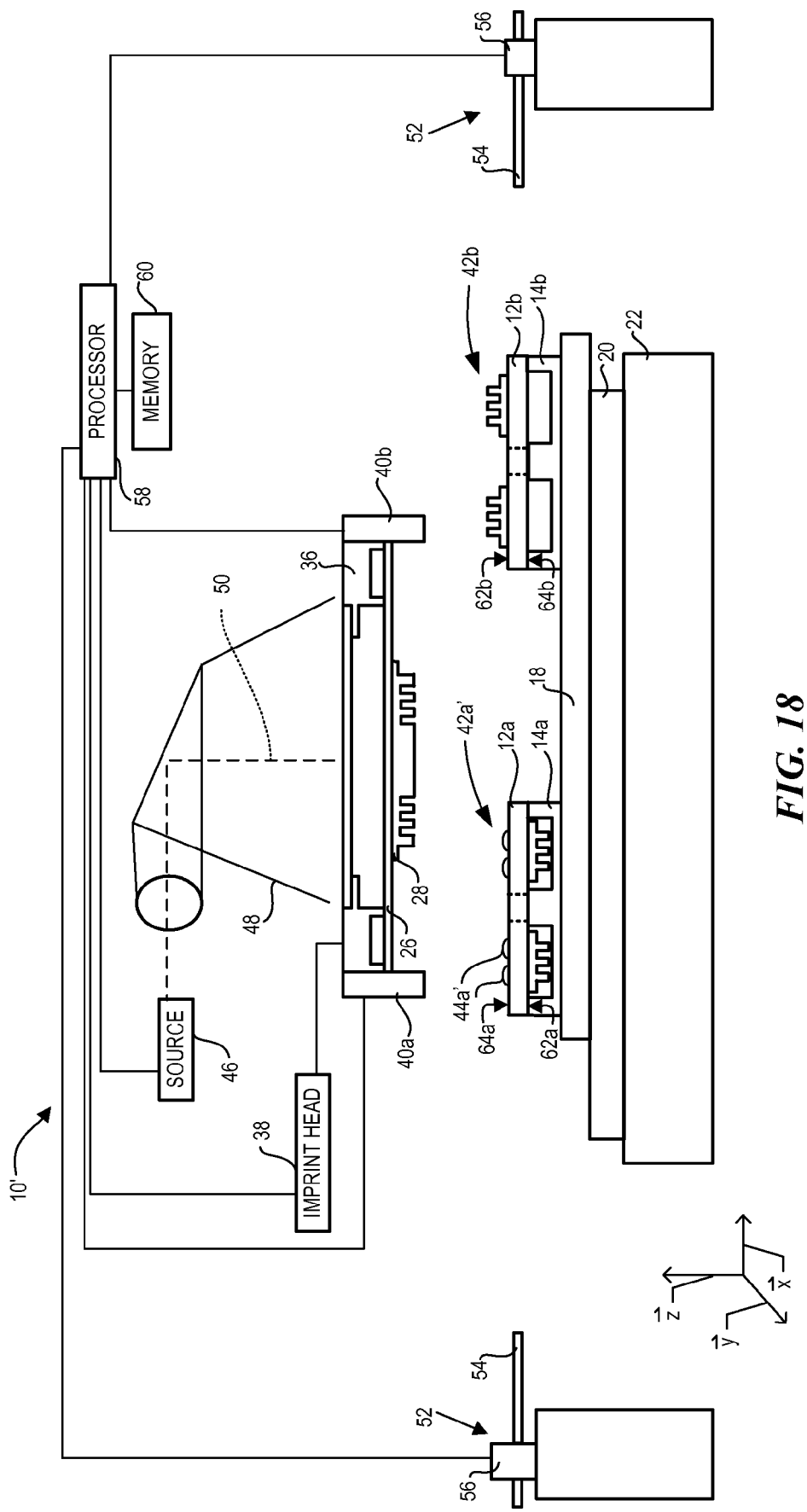
FIG. 18 is a simplified side view of the lithographic system shown in FIG. 17, with the first substrate having a material positioned thereon.

Referring to FIGS. 15 and 18, at step 218, first and second stages 18 and 20 may translate first substrate 12a such that a desired position may be obtained between first substrate 12a and first fluid dispenser 40a to position polymeric material 42a' on first substrate 12a. As shown polymeric material 42a' may be positioned upon first substrate 12a as a plurality of spaced-apart droplets 44a'.

Figure 19:
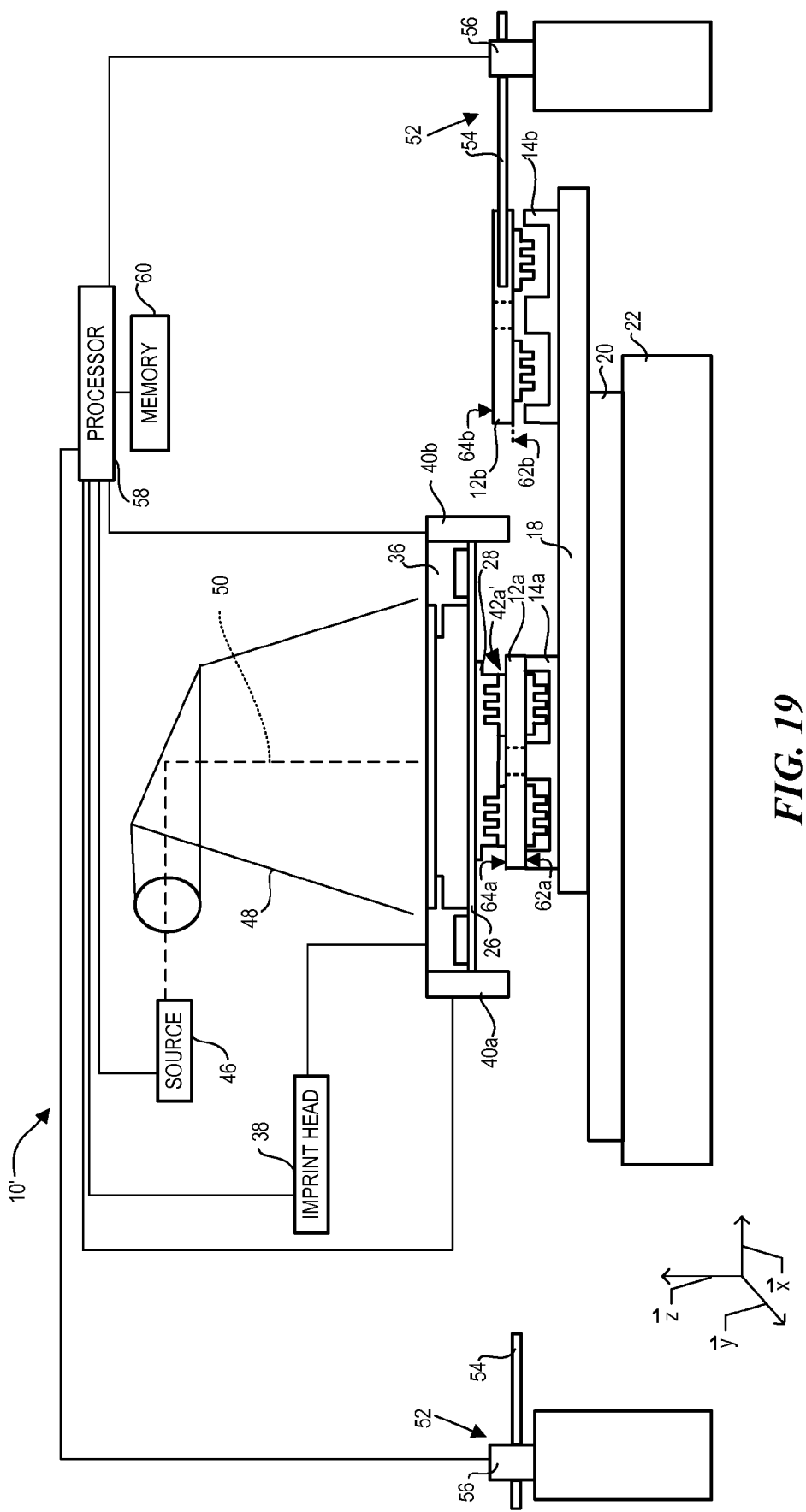
FIG. 19 is a simplified side view of the lithographic system shown in FIG. 18, with the mold contacting the material positioned on the first substrate and the robot flipping the second substrate with respect to the mold.
Figure 20:
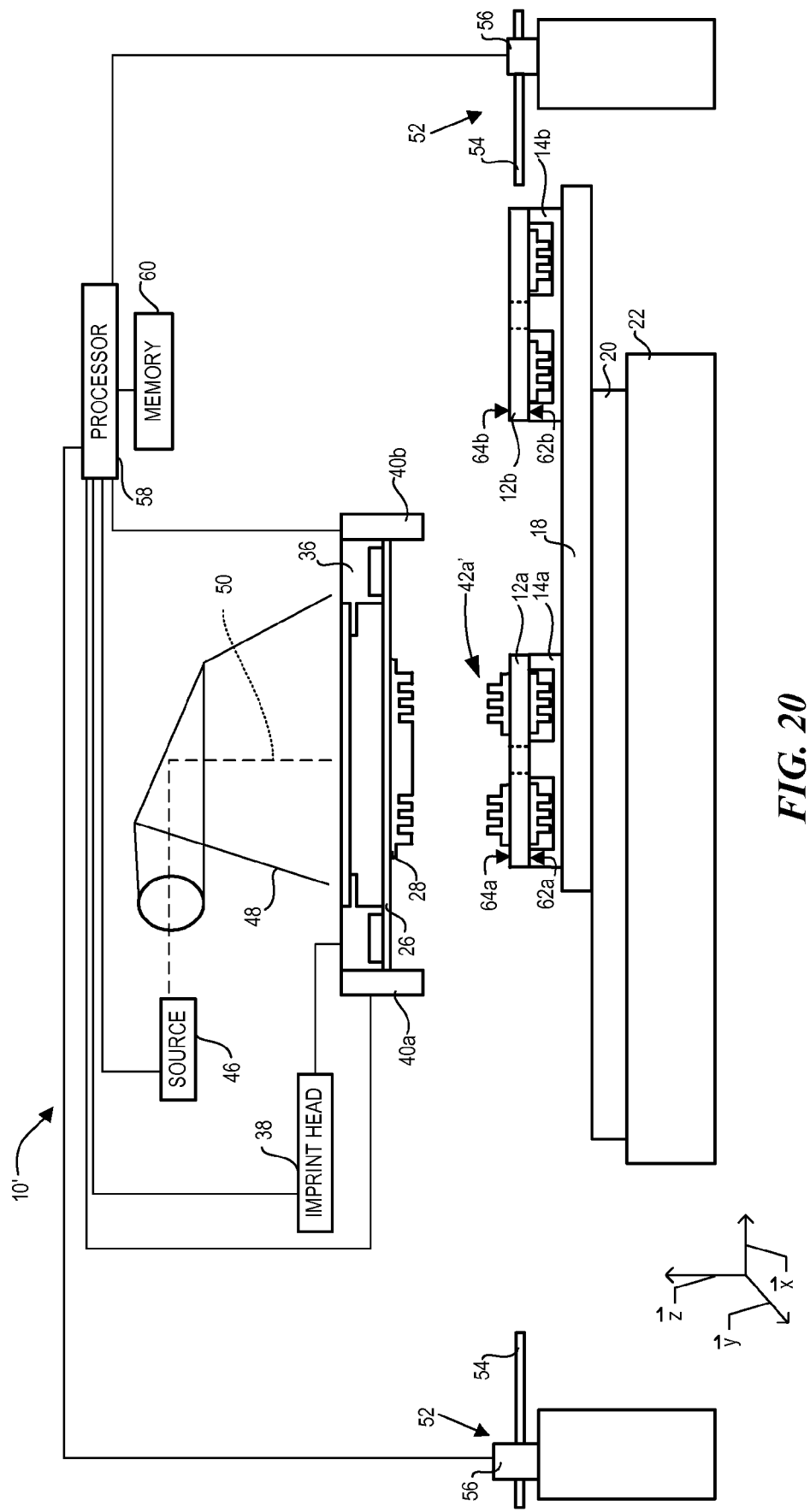
FIG. 20 is a simplified side view of the lithographic system shown in FIG. 19, with the mold being separated from the material on the first substrate and the second substrate positioned on the second substrate chuck in a second position.

Referring to FIGS. 15 and 19, at step 220, a desired spatial relationship may be obtained between first substrate 12a and mold 28. More specifically, first and second stages 18 and 20 and imprint head 38 may position first substrate chuck 14a such that first substrate 12a may be in superimposition with mold 28 and further polymeric material 42a' fills the desired volume between first substrate 12a and mold 28. Further, at step 220, after the desired volume is filled with polymeric material 42a', source 46 may produce energy 48, e.g., broadband ultraviolet radiation that causes polymeric material 42a' to solidify and/or cross-link conforming to a shape of second surface 64a of first substrate 12a and patterning surface 30 of mold 28. At step 222, concurrently with step 220, robot 52 may remove first substrate 12a from first substrate chuck 14a and rotate arm 54 around its axis to flip second substrate 12b 180° with respect to mold 28 and further robot 52 may position second substrate 12b upon second substrate chuck 14b such that second side 64b may be positioned opposite to that of second substrate chuck 14b, as shown in FIG. 20. Furthermore, polymeric material 42b may be positioned within cavity 16b of second substrate chuck 14b to minimize, if not prevent, damage to polymeric material 42b.

Referring to FIGS. 15 and 20, at step 224, mold 28 may be separated from polymeric material 42a' positioned on second side 64a of first substrate 12a. In a further embodiment, step 224 may occur concurrently with step 220 and step 222.

Figure 21:
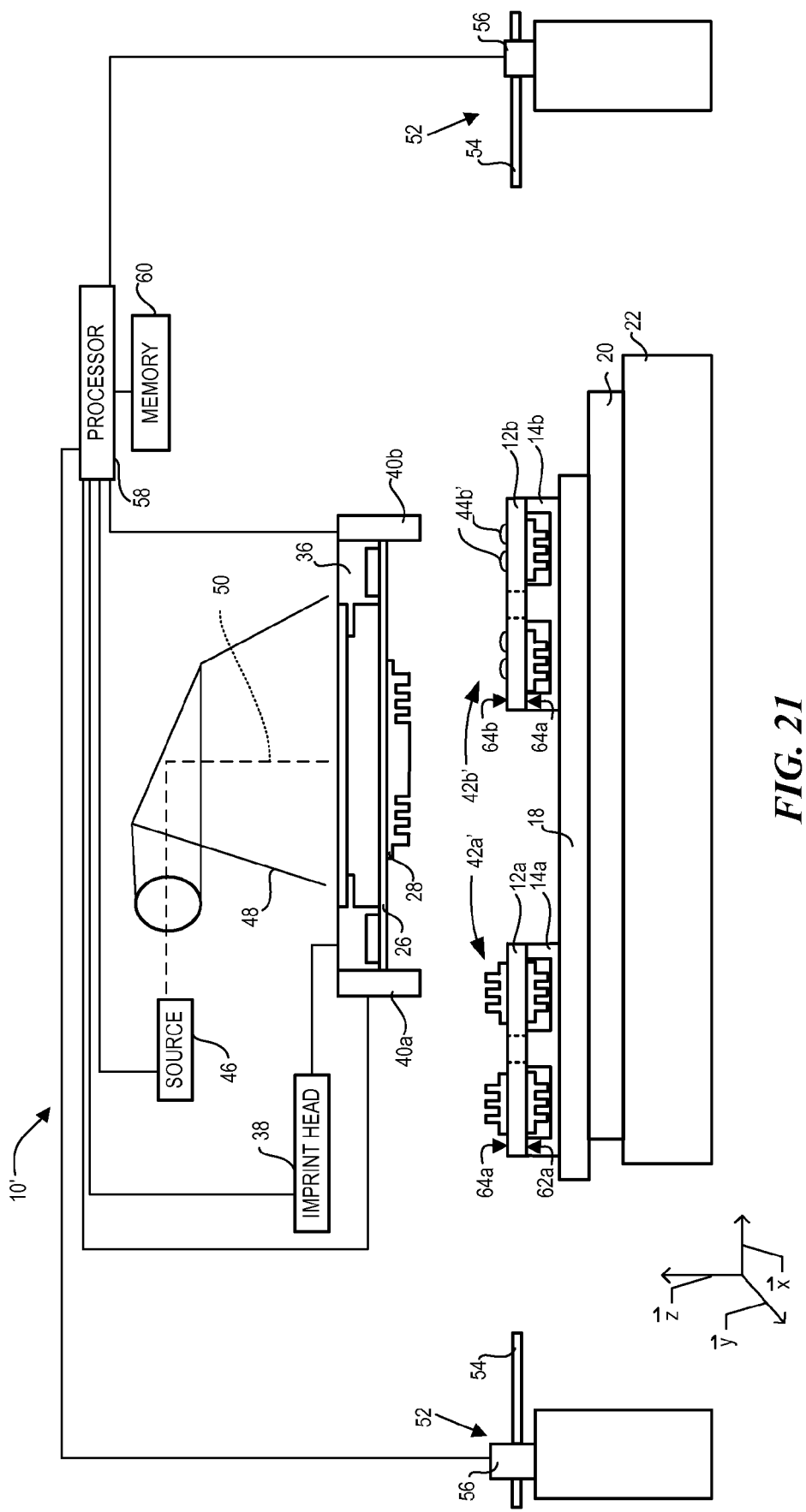
FIG. 21 is a simplified side view of the lithographic system shown in FIG. 20, with the second substrate having a material positioned thereon.

Referring to FIGS. 15 and 21, at step 226, first and second stages 18 and 20 may translate second substrate chuck 14b such that a desired position may be obtained between second substrate 12b and second fluid dispenser 40b to position polymeric material 42b' on second side 64b of second substrate 12b. As shown polymeric material 42b' may be positioned upon second substrate 12b as a plurality of spaced-apart droplets 44b'.

Figure 22:
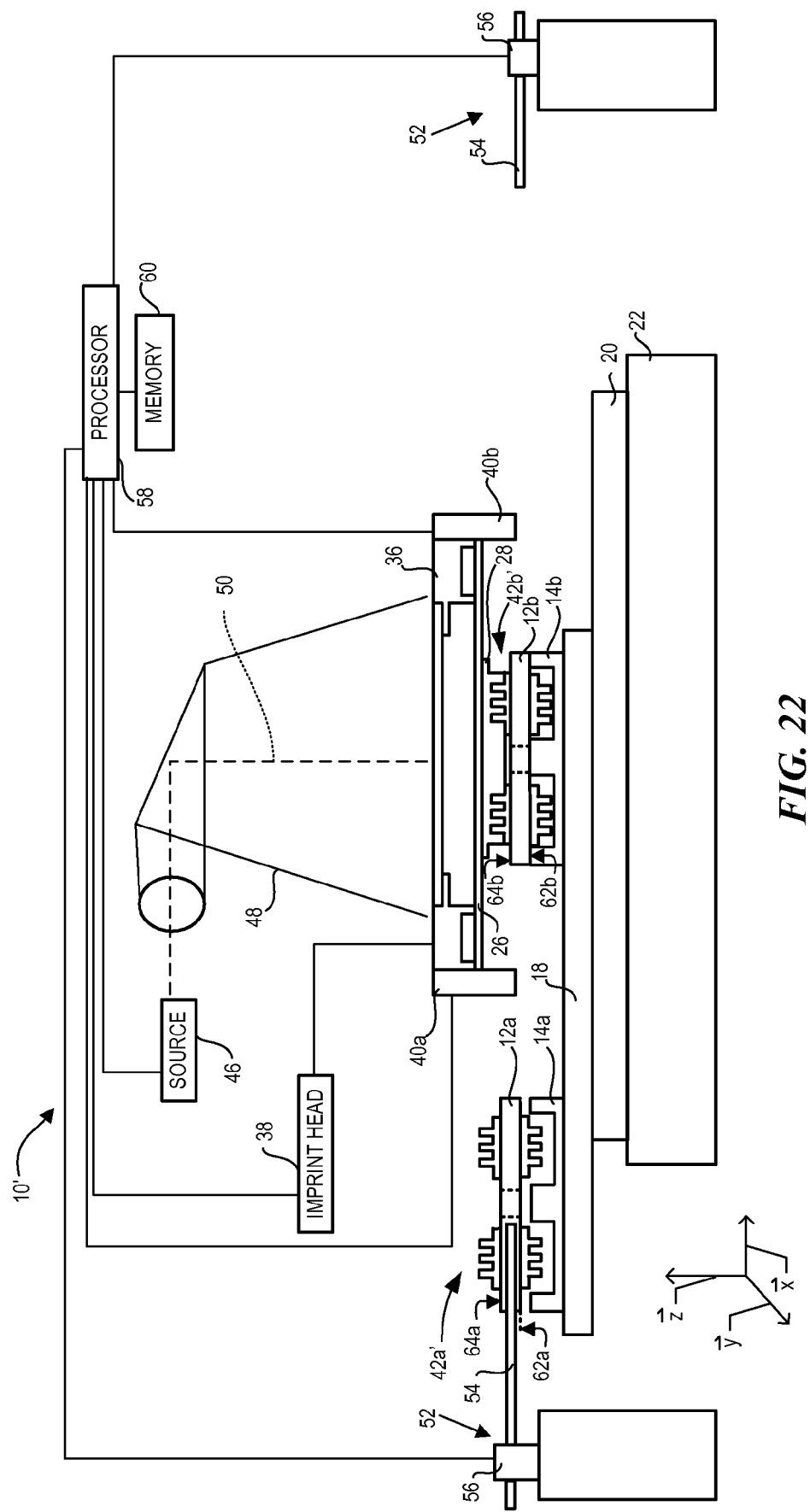
FIG. 22 is a simplified side view of the lithographic system shown in FIG. 21, with the mold contacting the material positioned on the second substrate and the robot removing the first substrate from the first substrate chuck.

Referring to FIGS. 15 and 22, at step 228, a desired spatial relationship may be obtained between second substrate 12b and mold 28. More specifically, first and second stages 18 and 20 and imprint head 38 may position second substrate chuck 14b such that second substrate 12b may be in superimposition with mold 28 and further polymeric material 42b' fills the desired volume between second substrate 12b and mold 28. Further, at step 228, after the desired volume is filled with polymeric material 42b', source 46 may produce energy 48, e.g., broadband ultraviolet radiation that causes polymeric material 42b' to solidify and/or cross-link conforming to a shape of second side 64b of second substrate 12b and patterning surface 30 of mold 28. At step 230, concurrently with step 228, robot 52 may remove first substrate 12a from first substrate chuck 14a and position the same within the substrate cassette (not shown) and further robot 52 may position a third substrate 12c upon first substrate chuck 14a. Robot 52 may transfer third substrate 12c from the substrate cassette (not shown) and position the same upon first substrate chuck 14a such that first side 62c may be positioned opposite to that of first substrate chuck 14a.

Figure 23:
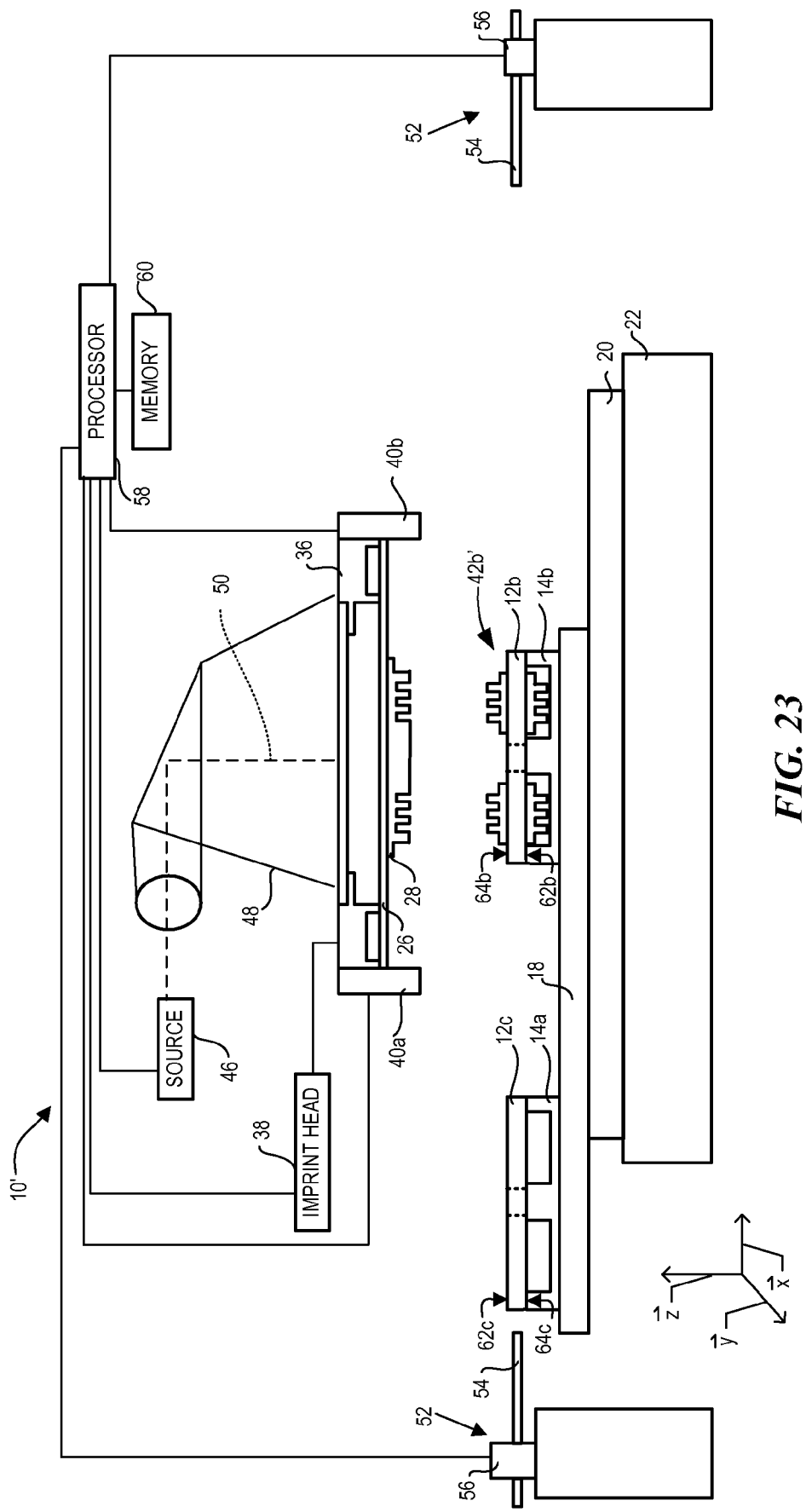
FIG. 23 is a simplified side view of the lithographic system shown in FIG. 22, with the mold being separated from the material on the second substrate and a third substrate positioned on the first substrate chuck.

Referring to FIGS. 15 and 23, at step 232, mold 28 may be separated from polymeric material 42b' positioned on second substrate 12b. In a further embodiment, step 232 may occur concurrently with step 228 and step 230.

Figure 24:
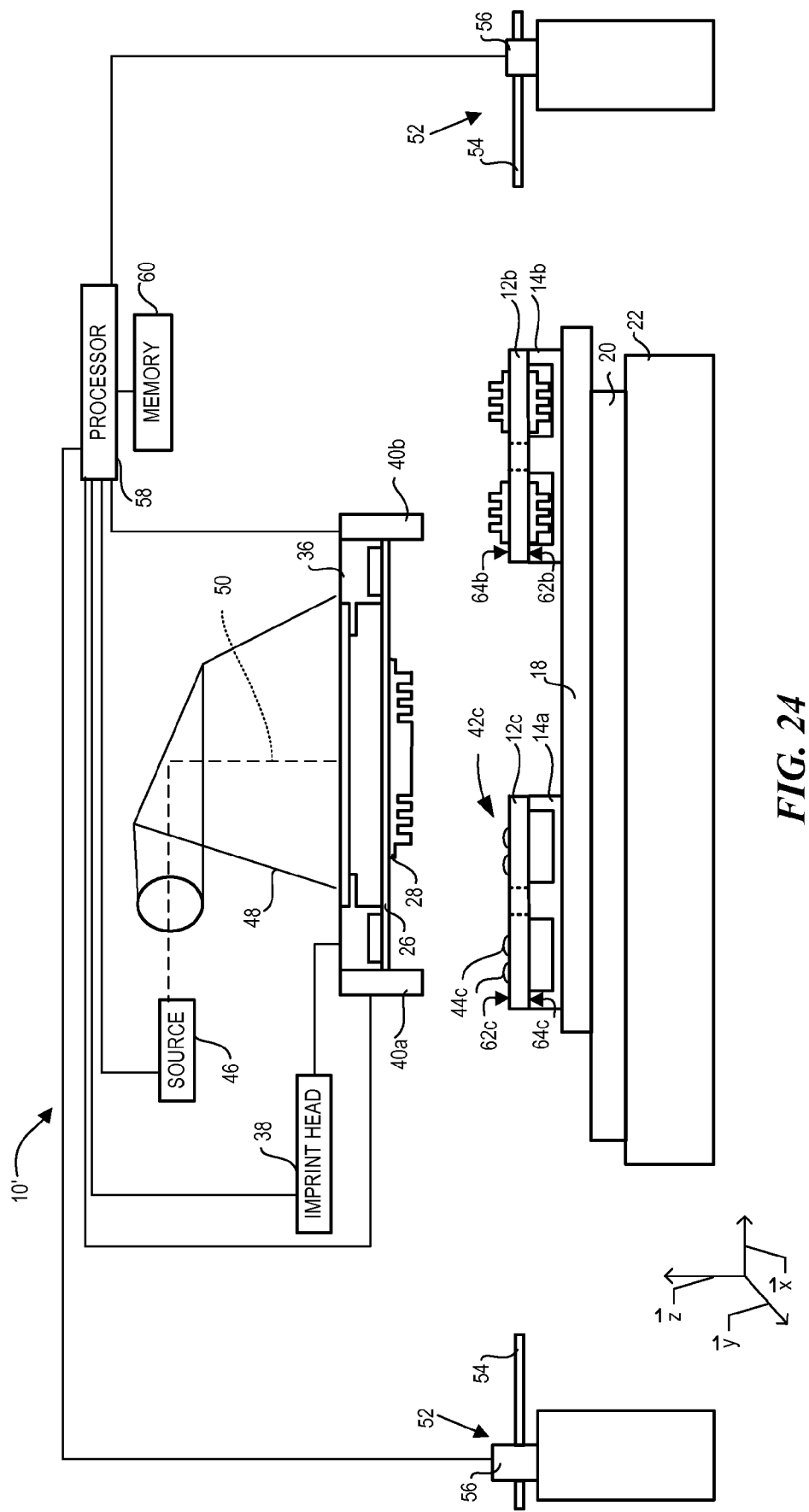
FIG. 24 is a simplified side view of the lithographic system shown in FIG. 23, with the third substrate having a material positioned thereon.

Referring to FIGS. 15 and 24, at step 234, first and second stages 18 and 20 may translate third substrate 12c such that a desired position may be obtained between third substrate 12c and first fluid dispensers 40a to position polymeric material 42c on third substrate 12c. As shown polymeric material 42c may be positioned upon third substrate 12c as a plurality of spaced-apart droplets 44c.

Figure 25:
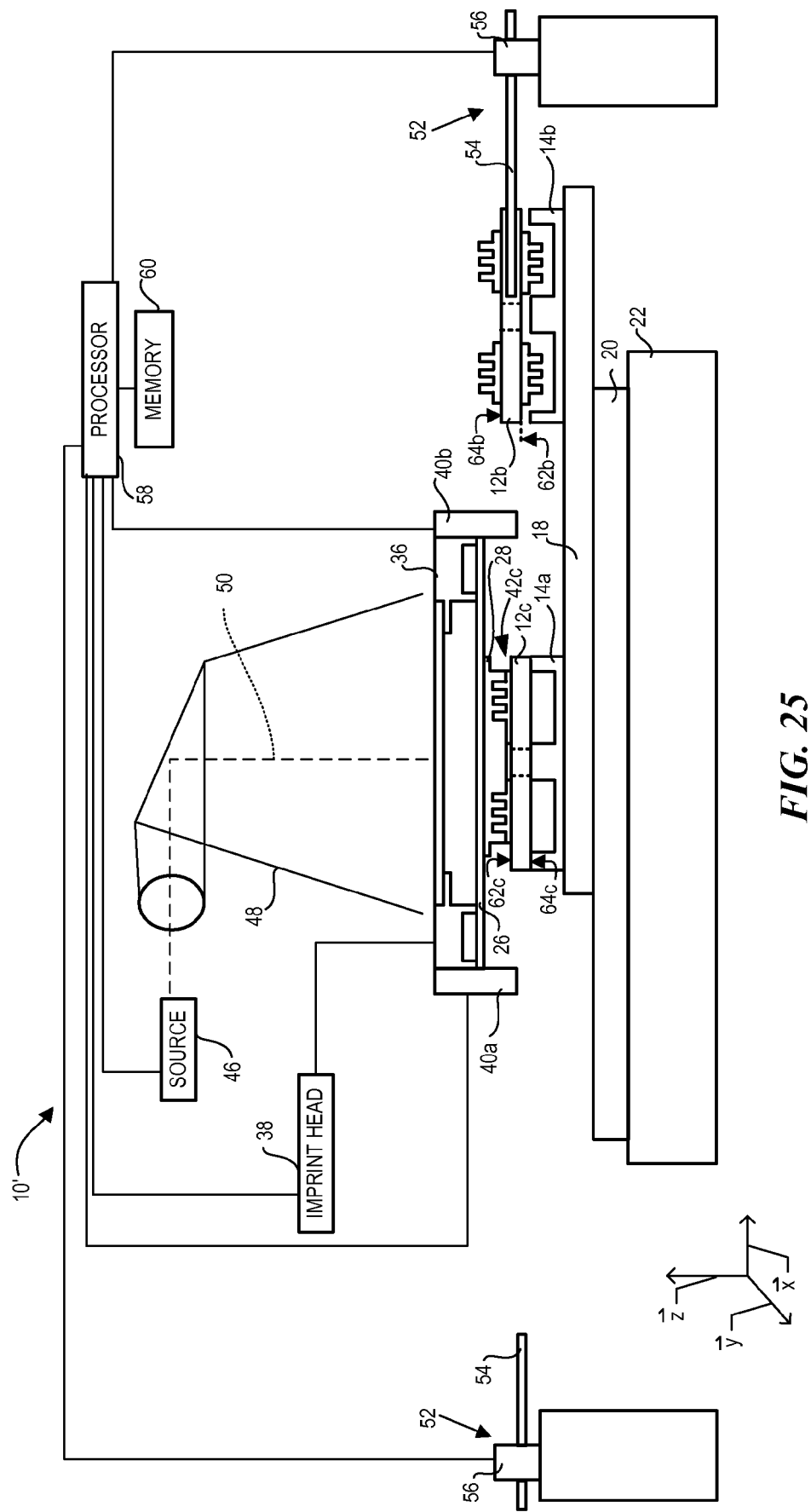
FIG. 25 is a simplified side view of the lithographic system shown in FIG. 24 with the mold contacting the material positioned on the third substrate and the robot removing the second substrate from the second substrate chuck.

Referring to FIGS. 15 and 25, at step 236, a desired spatial relationship may be obtained between third substrate 12c and mold 28. More specifically, first and second stages 18 and 20 and imprint head 38 may position first substrate chuck 14a such that third substrate 12c may be in superimposition with mold 28 and further polymeric material 42c fills the desired volume between third substrate 12c and mold 28. Further, at step 236, after the desired volume is filled with polymeric material 42c, source 46 may produce energy 48, e.g., broadband ultraviolet radiation that causes polymeric material 42c to solidify and/or cross-link conforming to a shape of first surface 62c of third substrate 12c and patterning surface 30 of mold 28. At step 238, concurrently with step 236, robot 52 may remove second substrate 12b from second substrate chuck 14b and position the same within the substrate cassette (not shown) and further robot 52 may position an additional substrate (not shown) upon second substrate chuck 14b. Robot 52 may transfer the additional substrate (not shown) from the substrate cassette (not shown) and position the same upon second substrate chuck 14b. Third substrate 12c and the additional substrate may be subjected to the aforementioned processing conditions, analogous to that of first and second substrates 12a and 12b.

Referring to FIGS. 4 and 15, furthermore, concurrently with patterning first substrate 12a, an additional substrate (not shown) may be patterned on second substrate chuck 14b prior to patterning of second substrate 12b. More specifically, at step 240, concurrently with step 200, the additional substrate (not shown), previously positioned on second substrate chuck 14b and having a polymeric material (not shown) positioned thereon, may have a pattern formed on a second side thereon analogous to that of step 228 shown in FIG. 22. Further, at step 242, mold 28 may be separated form the polymeric material (not shown) positioned on the additional substrate (not shown), analogous to that of step 232 shown in FIG. 23. To that end, step 206 may further include removing the additional substrate (not shown), analogous to that of step 238 shown in FIG. 25. Furthermore, step 200 may also further include removing a second additional substrate (not shown), previously patterned and positioned on first substrate chuck 13a prior to first substrate 12a, analogous to that of step 230, shown in FIG. 22.

To that end, in an example, the aforementioned process for patterning first and second sides 62a and 64a of first substrate 12a and first and second sides 62b and 64b of second substrate 12b may have a total process time per substrate of forty (40) seconds. More specifically, the time for each step of the aforementioned patterning process is shown more clearly in Chart 3:

relationship between the substrate and a mold with polymeric material filling a desired volume between the substrate and the mold and solidifying and/or cross-linking the polymeric material or separating the mold from the polymeric material occurs in parallel. As a result, a total increase in throughput of processing multiple substrates (and similarly, a decrease in total process time per substrate) may be obtained, which may be desirable. To that end, the above-mentioned processes may be employed in imprint lithography systems including, inter alia, a step-and-repeat system and a whole wafer system. The selection of the system is known to one skilled in the art and typically depends on the specific application which is desired.

Figure 26:
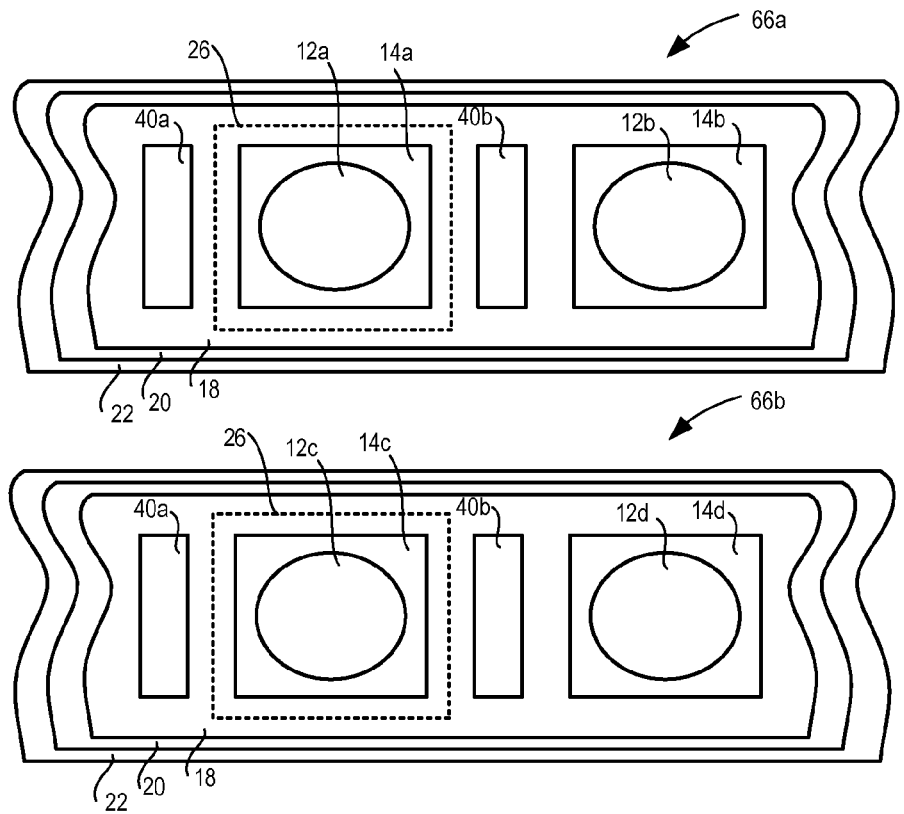
FIG. 26 is a simplified top down view of the lithographic system shown in FIG. 4, with the lithographic system have first and second modules each comprising first and second substrate chucks, with the first substrates being patterned.

Referring to FIG. 26, in a further embodiment, system 110 may comprise any number of substrate chucks. In an example, system 110 may comprise a first and a second module 66a and 66b. First module 66a may comprise first and second substrate chucks 14a and 14b and second module 66b

CHART 3

| | First substrate 12a | Second substrate 12b | Process Time (sec) |
|---|---|---|---|
| 1 | Remove the second additional substrate from first substrate chuck 14a/ Position first substrate 12a on first substrate chuck 14a such that first side 62a faces mold 28 | Obtain a desired spatial relationship between an additional substrate and mold 28 with polymeric material positioned thereon filling a desired volume between the additional substrate and mold 28 and solidifying and/or cross-linking the polymeric material/Separate mold 28 from polymeric material 42b | 19 |
| 2 | Obtain a desired spatial relationship between first substrate 12a and first fluid dispenser 40a to position polymeric material 42a on first side 62a of first substrate 12a | | 1 |
| 3 | Obtain a desired spatial relationship between first substrate 12a and mold 28 with polymeric material 42a filling a desired volume between first substrate 12a and mold 28 and solidifying and/or cross-linking polymeric material 42a/ Separate mold 28 from polymeric material 42a | Remove the additional substrate 12b from second substrate chuck 12b/Position second substrate 12b on second substrate chuck 14b such that first side 62b faces mold 28 | 19 |
| 4 | | Obtain a desired spatial relationship between second substrate 12b and second fluid dispenser 40b to position polymeric material 42b on first side 62b of second substrate 12b | 1 |
| 5 | Remove first substrate 12a from first substrate chuck 12a/Flip first substrate 12a/Position first substrate 12a on first substrate chuck 14a such that second side 64a faces mold 28 | Obtain a desired spatial relationship between second substrate 12b and mold 28 with polymeric material 42b filling a desired volume between second substrate 12b and mold 28 and solidifying and/or cross-linking polymeric material 42b/Separate mold 28 from polymeric material 42b | 19 |
| 6 | Obtain a desired spatial relationship between first substrate 12a and first dispenser 40a to position polymeric material 42a' on second side 64a of first substrate 12a | | 1 |
| 7 | Obtain a desired spatial relationship between first substrate 12a and mold 28 with polymeric material 42a' filling a desired volume between first substrate 12a and mold 28 and solidifying and/or cross-linking polymeric material 42b/ Separate mold 28 from polymeric material 42b | Remove second substrate 12b from second substrate chuck 12b/Flip second substrate 12b/ Position second substrate 12b on second substrate chuck 14b such that a second side 64b faces mold 28 | 19 |
| 8 | | Obtain a desired spatial relationship between second substrate 12b and second fluid dispenser 40b to position polymeric material 42b on second side 64b of second substrate 12b | 1 |
| | | Total/Substrate | 40 |

To that end, the steps for the aforementioned method of processing first and second sides 62a and 64a of first substrate 12a and first and second sides 62b and 64b of second substrate 12b may be performed in parallel. More specifically, analogous to that mentioned above with respect Chart 2, the steps of 1) positioning a substrate upon or removing a substrate from a substrate chuck and 2) obtaining a desired spatial may comprise third and fourth substrate chucks 14c and 14d. Third and fourth substrate chucks 14c and 14d may be analogous to that of first and second substrate chucks 14a and 14b, respectively, mentioned above with respect to FIG. 4. To that end, third and fourth substrate chucks 14c and 14d may have third and fourth substrates 12c and 12d positioned thereon, analogous to first and second substrate 12a and 12b mentioned above with respect to FIG. 4, and may be submitted to substantially the same processing conditions as mentioned above with respect to FIG. 15. More specifically, processing of first and second modules 66a and 66b may be occur in parallel, i.e., each module of first and second modules 66a and 66b may be subjected to the process as mentioned above with respect to FIG. 15, concurrently.

In an example, a substrate of first and second substrates 12a and 12b of first module 66a and a substrate of third and fourth substrates 12c and 12d of second module 66b may be patterned while concurrently the remaining substrate of first and second substrates 12a and 12b of first module 66a and the remaining substrate of third and fourth substrates 12c and 12d of second module 66b may be in the input/output process. More specifically, first substrate 12a may be patterned as analogous to that of steps 204 and 206 mentioned above with respect to FIGS. 8 and 15 and third substrate 12c may be patterned as analogous to that of steps 222 and 226 mentioned above with respect to FIGS. 15 and 22. Concurrently, second substrate 12b may be positioned upon second substrate chuck 14b as analogous to that of step 206 mentioned above with respect to FIGS. 8 and 15 and fourth substrate 12d may be removed (or removed and flipped) from fourth substrate chuck 14d analogous to that of step 230 mentioned above with respect to FIGS. 15 and 25 (or analogous to that of step 222 mentioned above with respect to FIGS. 15 and 19). Please note for simplicity of illustration, template 26 is shown as a dashed rectangle.

Figure 27:
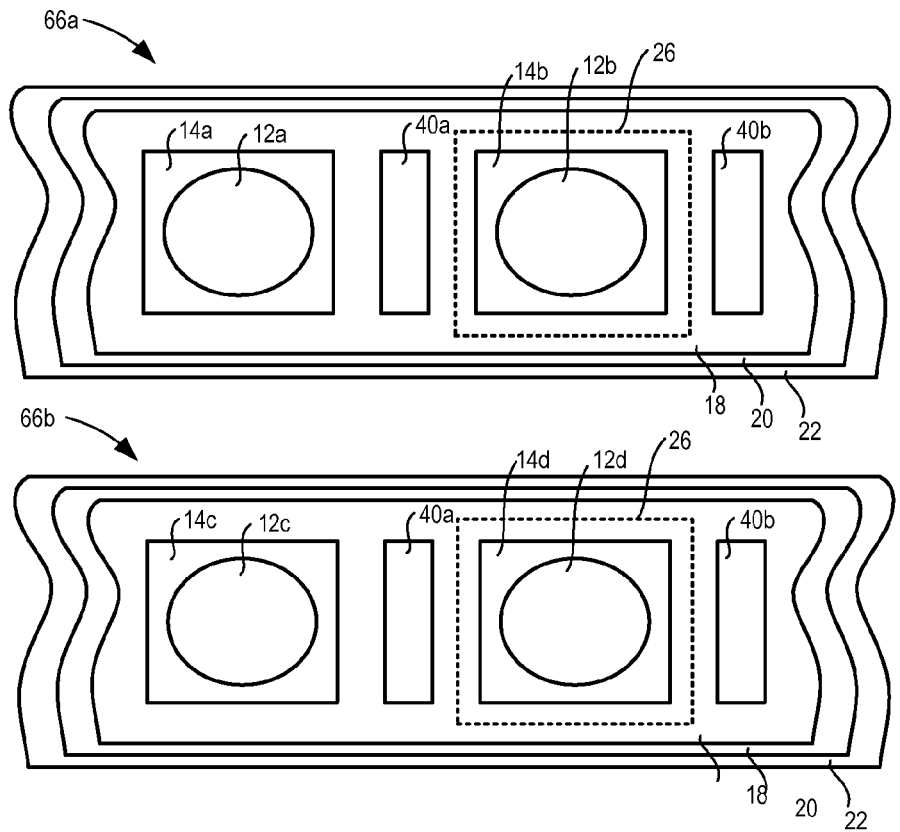
FIG. 27 is a simplified top down view of the lithographic system shown in FIG. 4, with the lithographic system have first and second modules each comprising first and second substrate chucks, with the second substrates being patterned.

Referring to FIG. 27, in a further example, second substrate 12b may be patterned as analogous to that of steps 204 and 206 mentioned above with respect to FIGS. 8 and 15 and fourth substrate 12d may be patterned as analogous to that of step 226 mentioned above with respect to FIGS. 15 and 22. Concurrently, first substrate 12a may be positioned upon first substrate chuck 14a as analogous to that of step 206 mentioned above with respect to FIGS. 8 and 15 and third substrate 12c may be removed (or removed and flipped) from third substrate chuck 14c analogous to that of step 230 mentioned above with respect to FIGS. 15 and 25 (or analogous to that of step 222 mentioned above with respect to FIGS. 15 and 19).

To that end, employing first and second modules 66a and 66b and the process mentioned above with respect to FIG. 15, a substrate having a patterned formed on first and second sides thereof may be formed every n seconds, with n seconds being the time to pattern a side of the substrate.

Figure 28:
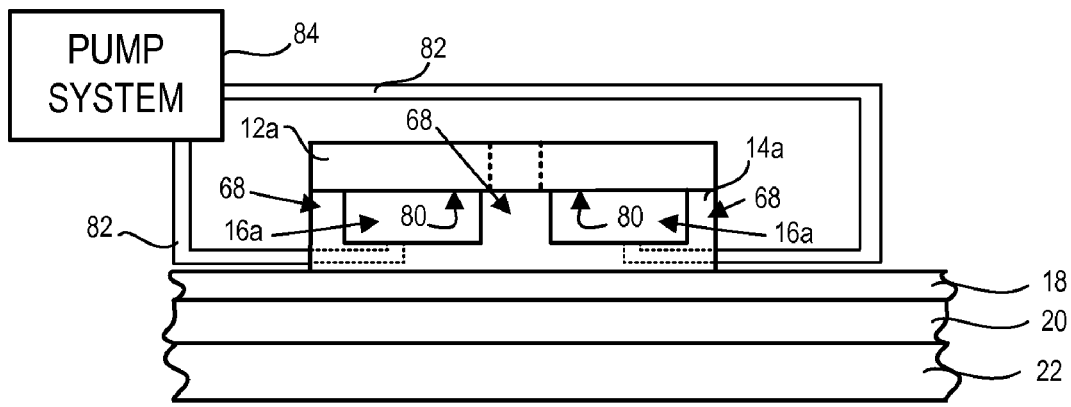
FIG. 28 is a simplified side view of a substrate chuck having a substrate positioned thereon.

Referring to FIG. 28, a cross-sectional view of first substrate chuck 14a having first substrate 12a positioned thereon is shown. First substrate chuck 14a may comprise a plurality of lands 68 positioned around an active area 80 of first substrate 12a. First substrate chuck 14a may further comprises a throughway 82 that may be in fluid communication with a pump system 84 to facilitate obtaining a desired pressure within cavity 16a. Control of pump system 84 may be regulated by processor 58.

Figure 29:
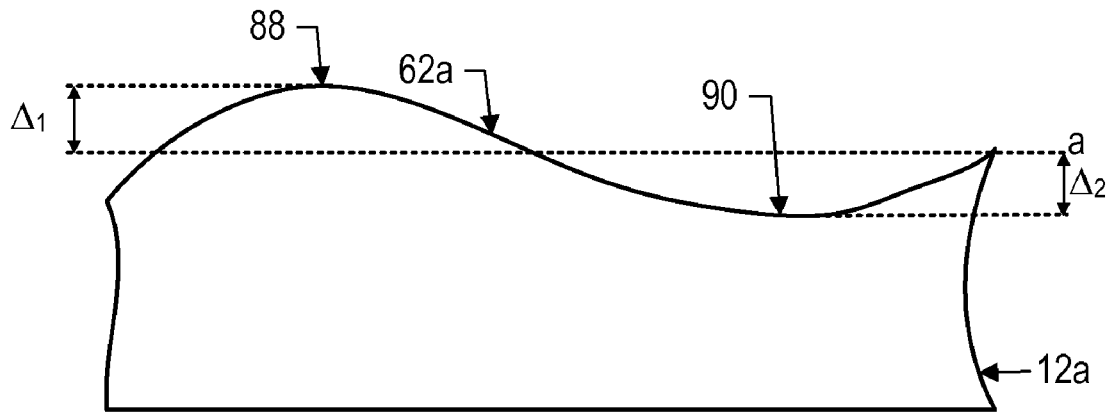
FIG. 29 is an exploded view of a portion of the substrate shown in FIG. 4.
Figure 30:
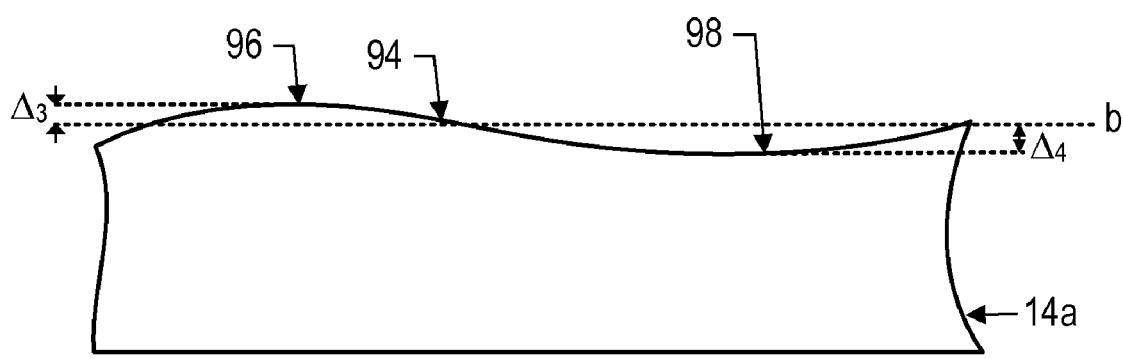
FIG. 30 is an exploded view of a portion of the substrate chuck shown in FIG. 4.

Furthermore, it may be desired to subject first and second substrates 12a and 12b to substantially the same process conditions. To that end, referring to FIG. 29, a portion 86 of first substrate 12a, shown in FIG. 4, is depicted, wherein portion 86 displays a level of planarity of first side 62a of first substrate 12a. First side 62a comprises a plurality of hills and valleys; however, only hill 88 and valley 90 are shown. The plurality of hills and valleys of first side 62a define an average plane of planarity, shown as plane 'a,' of first side 62a. However, the plurality of hills and valleys of first side 62a may deviate from plane 'a' by differing magnitudes and wherein, for simplicity, each deviation may be defined as $\Delta_{dev1}$. More specifically, a zenith of hill 88 may deviate from plane 'a' a magnitude $\Delta_1$ and a nadir of valley 90 may deviate from plane 'a' a magnitude $\Delta_2$. The above may be equally applied to second side 64a of first substrate 12a as well as first and second sides 62b and 64b of second substrate 12b. Referring to FIG. 30, a portion 92 of first substrate chuck 14a, shown in FIG. 4, is depicted, wherein portion 92 displays a level of planarity of a surface 94 of first substrate chuck 14a. Surface 94 comprises a plurality of hills and valleys; however, only hill 96 and valley 98 are shown. The plurality of hills and valleys of surface 94 define an average plane of planarity, shown as plane 'b,' of surface 94. However, the plurality of hills and valleys of surface 94 may deviate from plane 'b' by differing magnitudes and wherein, for simplicity, each deviation may be defined as $\Delta_{dev2}$. More specifically, a zenith of hill 96 may deviate from plane 'b' a magnitude $\Delta_3$ and a nadir of valley 98 may deviate from plane 'b' a magnitude $\Delta_4$. The above may be equally applied to second substrate chuck 12b. To that end, $\Delta_{dev2}$, the deviation in thickness of surface 94 of substrate chuck 14b may be less than $\Delta_{dev1}$, the deviation in thickness of first side 62a (or second side 64a) of first substrate 12a. As a result, subjecting first and second substrates 12a and 12b to substantially the same process conditions may be facilitated.

Furthermore, first and second fluid dispensers 40a and 40b may be calibrated with respect to each other such that first and second substrates 12a and 12b may be subjected to substantially the same process conditions. More specifically, first fluid dispenser 40a may be instructed by processor 58 to position a volume $V_1$ of polymeric material 42a upon first substrate 12a; however, first fluid dispenser 40a may position a volume $V_2$ of polymeric material 42a upon first substrate 12a, with volume $V_2$ differing from volume $V_1$ and volume $V_1$ being the desired volume. This may result from a miscalibration of first fluid dispenser 40a, i.e. dispensing a different volume of fluid than instructed to. To that end, the difference between volumes $V_1$ and $V_2$ may be calculated such that processor 58, operating on computer readable program stored in memory 60, may instruct first fluid dispenser 40a to position a volume $V_3$ upon first substrate 12a to compensate for the miscalibration such that first fluid dispenser 40a may position volume $V_1$ upon first substrate 12a. The above may be equally applied to second fluid dispenser 40b. To that end, subjecting first and second substrates 12a and 12b to substantially the same process conditions may be facilitated.

Further, polymeric material 42a and 42b, positioned on first and second substrates 12a and 12b, respectively, may be subjected to differing evaporation conditions as a result of being positioned on differing substrate chucks, and thus, a volume of polymeric material 42a and 42b may differ, which is undesirable. More specifically, an air flow and temperature of an environment associated with polymeric material 42a, first substrate 12a, and first substrate chuck 14a may differ that an environment associated with polymeric material 42b, second substrate 42b, and second substrate chuck 14b. As a result, first fluid dispenser 40a may position a volume $V_4$ of polymeric material 42a upon first substrate 12a and second fluid dispenser 40b may positioned a volume $V_5$, differing from volume $V_4$, of polymeric material 42b upon second substrate 12b to compensate for the aforementioned evaporative conditions such that after exposure of polymeric material 42a and 42b to the evaporative conditions, polymeric material 42a and 42b comprises a volume $V_6$ and $V_7$, respectively, with volumes $V_6$ and $V_7$ being substantially the same.

Furthermore, a geometric location of first and second fluid dispensers 40a and 40b with respect to first and second substrates 12a and 12b, respectively, may be substantially the same to facilitate subjecting first and second substrates 12a and 12b to substantially the same process conditions. More specifically, a distance between first fluid dispenser 40a and first substrate 12a may be substantially the same as a distance between second fluid dispenser 40b and second substrate 40b.

To further facilitate first and second substrates 12a and 12b being subjected to substantially the same process conditions, a reflectivity of surface 94 of first and second substrate chucks 14a and 14b may be substantially the same such that the solidification and/or cross-linking of first and second materials 42a and 42b may be substantially the same.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method for patterning first and second substrates in a nanoimprint lithography system, said method comprising:
    positioning said first substrate on a first substrate chuck having a cavity, a first side of said first substrate positioned toward a nanoimprint mold assembly, and a second side of said first substrate positioned toward said first substrate chuck;
    positioning a nanoimprint material on said first side of said first substrate; obtaining a spatial relationship between said first substrate and said nanoimprint mold assembly and imprinting a pattern in said nanoimprint material on said first side of said first substrate with said nanoimprint mold assembly while concurrently positioning said second substrate on a second substrate chuck;
    separating said nanoimprint mold assembly from said nanoimprint material on said first substrate;
    positioning a nanoimprint material on said second substrate;
    removing said first substrate from said first substrate chuck while concurrently obtaining a spatial relationship between said second substrate and said nanoimprint mold assembly and imprinting a pattern in said nanoimprint material on said second substrate with said nanoimprint mold assembly;
    separating said nanoimprint mold assembly from said nanoimprint material on said second substrate; and with said first and second substrates being subjected to substantially the same process conditions
    wherein the step of removing said first substrate further comprises a step of flipping said first substrate 180 degrees with respect to said nanoimprint mold assembly such that said nanoimprint material on said first substrate is positioned within said cavity of said first substrate chuck.

2. The method as recited in claim 1 further including the step of removing said second substrate from said second substrate chuck.

3. The method as recited in claim 2 wherein the step of removing said second substrate further comprises a step of flipping said second substrate 180 degrees with respect to said nanoimprint mold assembly.

4. The method as recited in claim 1 wherein the step of positioning said first substrate further comprises a step of obtaining a spatial relationship between said first substrate and said nanoimprint mold assembly and forming a pattern in a nanoimprint material on said third substrate, said third substrate being positioned on said second substrate chuck.

5. The method as recited in claim 1 wherein the step of obtaining a spatial relationship between said first substrate and said nanoimprint mold assembly further comprises a step of concurrently removing a third substrate from said second substrate chuck.

6. The method as recited in claim 1 wherein the step of removing said first substrate from said first substrate chuck further comprises a step of concurrently positioning a third substrate on said first substrate chuck.

7. The method as recited in claim 1 further including translating said first and second substrate chucks about an axis parallel to said first and second substrates.

8. The method as recited in claim 1 further including rotating said first and second substrate chucks about an axis perpendicular to said first and second substrates.

9. A method for processing first and second substrates in a nanoimprint lithography system, said method comprising the steps of:
    obtaining a first spatial relationship between a first substrate chuck having a cavity and a nanoimprint mold assembly and a second spatial relationship, differing from said first spatial relationship, between a second substrate chuck and said nanoimprint mold assembly such that a pattern may be imprinted in a nanoimprint material on said first substrate, positioned on said first substrate chuck, with said nanoimprint mold assembly while concurrently obtaining a desired spatial relationship between said second substrate and said second substrate chuck;
    separating said nanoimprint mold assembly from said nanoimprint material on said first substrate; and,
    flipping said first substrate 180 degrees with respect to said nanoimprint mold assembly such that said nanoimprint material on said first substrate is positioned within said cavity of said first substrate chuck.

10. The method as recited in claim 9 wherein said first and second substrates are subjected to substantially the same process conditions.

11. The method as recited in claim 9 wherein the step of obtaining a desired spatial relationship between said second substrate and said second substrate chuck further includes positioning said second substrate on said second substrate chuck.

12. The method as recited in claim 9 wherein the step of obtaining a desired spatial relationship between said second substrate and said second substrate chuck further includes removing said second substrate from being positioned on said second substrate chuck.

13. The method as recited in claim 12 wherein the step of removing said second substrate further comprises a step of flipping said second substrate 180 degrees with respect to said nanoimprint mold assembly.

14. The method as recited in claim 9 further including positioning said first substrate on said first substrate chuck.

15. The method as recited in claim 9 further including positioning said nanoimprint material on said first substrate.

16. A method for patterning first and second substrates, said method comprising:
    positioning said first substrate on a first substrate chuck having a cavity, a first side of said first substrate positioned toward a mold assembly, and a second side of said first substrate positioned toward said first substrate chuck;
    positioning a material on said first substrate;
    obtaining a spatial relationship between said first substrate and said mold assembly and forming a pattern in said material on said first substrate with said mold assembly while concurrently positioning said second substrate on a second substrate chuck;

separating said mold assembly from said material on said first substrate;

positioning a material on said second substrate;

removing said first substrate from said first substrate chuck while concurrently obtaining a spatial relationship between said second substrate and said mold assembly and forming a pattern in said material on said second substrate with said mold assembly, wherein removing said first substrate includes flipping said first substrate 180 degrees with respect to said mold assembly such that said material on said first substrate is positioned within said cavity of said first substrate chuck;

separating said mold assembly from said material on said second substrate; and with said first and second substrates being subjected to substantially the same process conditions.

17. The method as recited in claim 16 further including the step of removing said second substrate from said second substrate chuck.

18. The method as recited in claim 17 wherein the step of removing said second substrate further comprises a step of flipping said second substrate 180 degrees with respect to said mold assembly.

19. The method as recited in claim 16 wherein the step of positioning said first substrate further comprises a step of obtaining a spatial relationship between a third substrate and said mold assembly and forming a pattern in a material on said third substrate, said third substrate being positioned on said second substrate chuck.

20. The method as recited in claim 16 wherein the step of obtaining a spatial relationship between said first substrate and said mold assembly further comprises a step of concurrently removing a third substrate from said second substrate chuck.

21. The method as recited in claim 16 wherein the step of removing said first substrate from said first substrate chuck further comprises a step of concurrently positioning a third substrate on said first substrate chuck.

* * * * *